(12) United States Patent
Tam

(10) Patent No.: US 9,204,025 B1
(45) Date of Patent: Dec. 1, 2015

(54) CAMERA MODULE WITH A MOLDED ENCLOSURE CONTAINED IN A FLEXIBLE SUBSTRATE

(71) Applicant: Amazon Technologies, Inc., Reno, NV (US)

(72) Inventor: Samuel Waising Tam, Daly City, CA (US)

(73) Assignee: Amazon Technologies, Inc., Reno, NV (US)

( * ) Notice: Subject to any disclaimer, the term of this patent is extended or adjusted under 35 U.S.C. 154(b) by 0 days.

(21) Appl. No.: 14/109,502

(22) Filed: Dec. 17, 2013

Related U.S. Application Data

(60) Provisional application No. 61/872,475, filed on Aug. 30, 2013.

(51) Int. Cl.
  *H04N 5/225* (2006.01)
  *H01L 27/146* (2006.01)
  *H04M 1/02* (2006.01)

(52) U.S. Cl.
  CPC .......... *H04N 5/2257* (2013.01); *H01L 27/1469* (2013.01); *H01L 27/14643* (2013.01); *H04M 1/0264* (2013.01); *H04N 5/2254* (2013.01)

(58) Field of Classification Search
  CPC .............. H04N 5/2254; H04N 5/2257; H01L 27/14643; H01L 27/1469; H01L 27/14618; H04M 1/0264
  See application file for complete search history.

(56) References Cited

U.S. PATENT DOCUMENTS

| | | | |
|---|---|---|---|
| 7,230,777 B2 | 6/2007 | Ye | |
| 7,525,096 B2 | 4/2009 | Nakajo et al. | |
| 7,555,211 B2 | 6/2009 | Go | |
| 7,570,297 B2 * | 8/2009 | Maeda et al. | 348/340 |
| 7,633,543 B2 * | 12/2009 | Shinomiya | 348/340 |
| 7,884,875 B2 | 2/2011 | Kwon et al. | |
| 7,948,555 B2 | 5/2011 | Kwon et al. | |
| 8,009,971 B2 | 8/2011 | Koo et al. | |
| 8,089,694 B2 | 1/2012 | Wernersson | |
| 8,092,102 B2 | 1/2012 | Shangguan et al. | |
| 8,149,321 B2 | 4/2012 | Ryu et al. | |
| 8,170,408 B2 | 5/2012 | Nasiri et al. | |
| 8,174,583 B2 | 5/2012 | Ko et al. | |
| 8,223,249 B2 | 7/2012 | Chang | |
| 8,248,514 B1 | 8/2012 | Chang | |
| 8,248,523 B2 | 8/2012 | Chua et al. | |
| 8,405,756 B2 | 3/2013 | Yano et al. | |

(Continued)

FOREIGN PATENT DOCUMENTS

WO    WO2012038703 A2 *  3/2012 ............. H04N 5/225

OTHER PUBLICATIONS

Chowdhury, et al., "Challenges of Megapixel Camera Module Assembly and Test" Proceedings of 2005 Electronic Components and Technology Conference, pp. 1390-1401.

(Continued)

Primary Examiner — Jason Flohre
(74) Attorney, Agent, or Firm — K&L Gates LLP

(57) ABSTRACT

Systems and methods of manufacturing compact camera modules for use in electronic device are provided. The camera module includes a lens housing and a substrate assembly. The substrate assembly includes a flexible substrate wrapped around a molded enclosure. The optical image stabilization components for the camera module may be enclosed within the molded enclosure.

18 Claims, 22 Drawing Sheets

(56) References Cited

U.S. PATENT DOCUMENTS

| | | |
|---|---|---|
| 8,430,579 B2 | 4/2013 | Tam et al. |
| 2002/0167081 A1* | 11/2002 | Kondo ................ 257/686 |
| 2004/0115866 A1* | 6/2004 | Bang et al. ............ 438/125 |
| 2004/0212719 A1 | 10/2004 | Ikeda |
| 2005/0024752 A1 | 2/2005 | Webster |
| 2008/0170141 A1* | 7/2008 | Tam et al. ............ 348/294 |
| 2008/0252771 A1 | 10/2008 | Wu |
| 2009/0190025 A1* | 7/2009 | Lu ........................ 348/374 |
| 2010/0053423 A1 | 3/2010 | Singh |
| 2011/0075999 A1* | 3/2011 | Chiu ...................... 396/55 |
| 2011/0102667 A1 | 5/2011 | Chua et al. |
| 2011/0122267 A1* | 5/2011 | Ahn et al. ........... 348/208.7 |
| 2011/0150462 A1* | 6/2011 | Chiu et al. ............ 396/542 |
| 2011/0194014 A1 | 8/2011 | Ozaki |
| 2011/0194023 A1* | 8/2011 | Tam et al. ............ 348/374 |
| 2011/0262121 A1* | 10/2011 | Yanagisawa et al. ..... 396/55 |
| 2011/0267535 A1 | 11/2011 | Seo et al. |
| 2012/0242883 A1 | 9/2012 | Pavithran et al. |
| 2012/0276951 A1 | 11/2012 | Webster et al. |
| 2012/0312976 A1 | 12/2012 | Boulanger et al. |
| 2013/0050571 A1 | 2/2013 | Tam |
| 2013/0107068 A1 | 5/2013 | Kim et al. |
| 2013/0128106 A1* | 5/2013 | Tam et al. ............ 348/374 |

OTHER PUBLICATIONS

Non-Final Office Action dated Mar. 17, 2015 in U.S. Appl. No. 14/109,491, filed Dec. 17, 2013.

\* cited by examiner

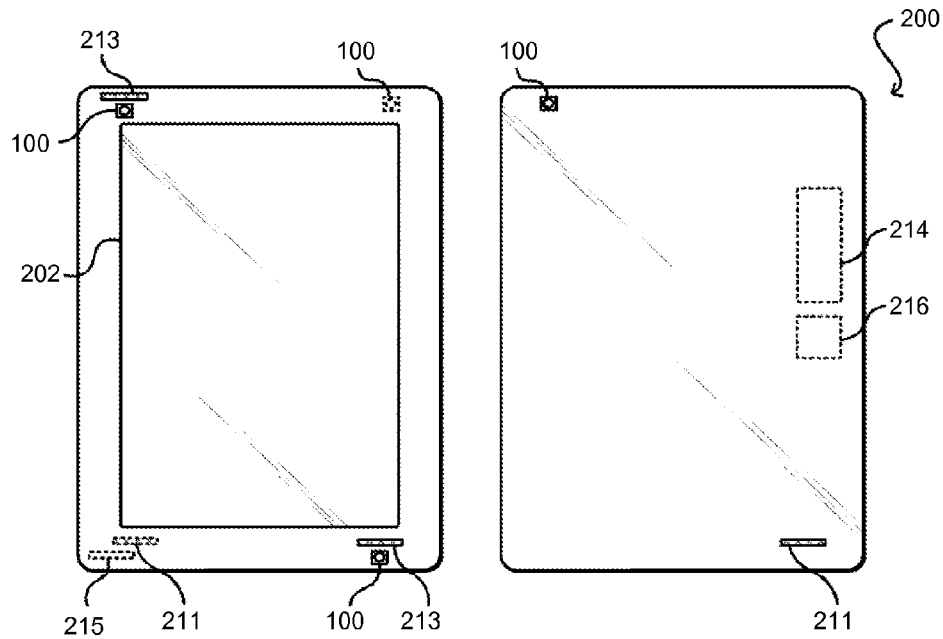
FIG. 2A  FIG. 2B
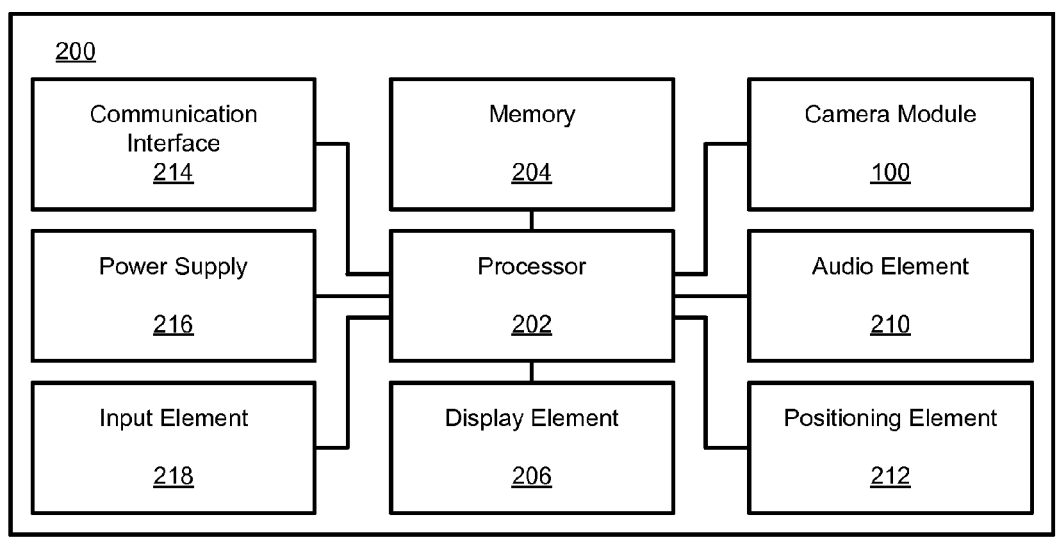
FIG. 3

CAMERA MODULE WITH A MOLDED ENCLOSURE CONTAINED IN A FLEXIBLE SUBSTRATE

CROSS-REFERENCE TO RELATED APPLICATIONS

This application claims the benefit of U.S. Provisional Application No. 61/872,475, filed Aug. 30, 2013, the disclosure of which is incorporated herein by reference in its entirety.

BACKGROUND

Digital camera functionality is being incorporated into a wide variety of electronic devices. In particular, there is an increased demand by consumers for high quality photographic capability in consumer electronics and mobile computing devices, such as mobile phones, smartphones, and tablet computers. However, there is also high demand for mobile computing devices with increasingly small form factors, with extremely thin devices being particularly desirable for both aesthetics and portability. In addition, there is an ongoing desire to improve quality and functionality while decreasing the cost of components and manufacturing.

One common problem experienced by photographers is blurry images caused by shaking of the camera during image capture. Image stabilization technology has been developed to reduce the amount of blurring associated with the movement of the camera. One common approach is optical image stabilization, which utilizes gyro-sensors to detect the angular velocity of the camera. The lens or image sensor is moved in response to this detection, to stabilize the recorded image by varying the optical path to the image sensor. Unfortunately, the various components used to perform image stabilization can consume an undesirably large amount of space inside of the electronic device's housing.

Accordingly, there is a need for improved camera module designs and manufacturing processes for incorporation into electronic devices.

BRIEF DESCRIPTION OF DRAWINGS

FIGS. 2A-2B illustrate front and back views, respectively, of an example portable computing device that may incorporate a camera module in accordance with embodiments of the present invention.

FIG. 3 is an example block diagram illustrating basic components of a computing device, in accordance with embodiments of the present invention.

DETAILED DESCRIPTION

In the following description, reference is made to the accompanying drawings which illustrate several embodiments of the present invention. It is understood that other embodiments may be utilized and mechanical, compositional, structural, electrical, and operational changes may be made without departing from the spirit and scope of the present disclosure. The following detailed description is not to be taken in a limiting sense, and the scope of the embodiments of the present invention is defined only by the claims of the issued patent.

Systems and methods in accordance with various embodiments of the present disclosure provide improved manufacturing methods and camera module designs that are compact, inexpensive to manufacture, and reliable in operation. These designs may provide small form factor autofocus (AF) camera modules for incorporation into thin mobile devices, such as tablets or smartphones. In accordance with some embodiments, a camera module includes a flexible substrate wrapped around a molded enclosure. The optical image stabilization components for the camera module may be encapsulated within the molded enclosure. The resulting camera module can achieve a compact footprint with low manufacturing costs.

Figure 1:
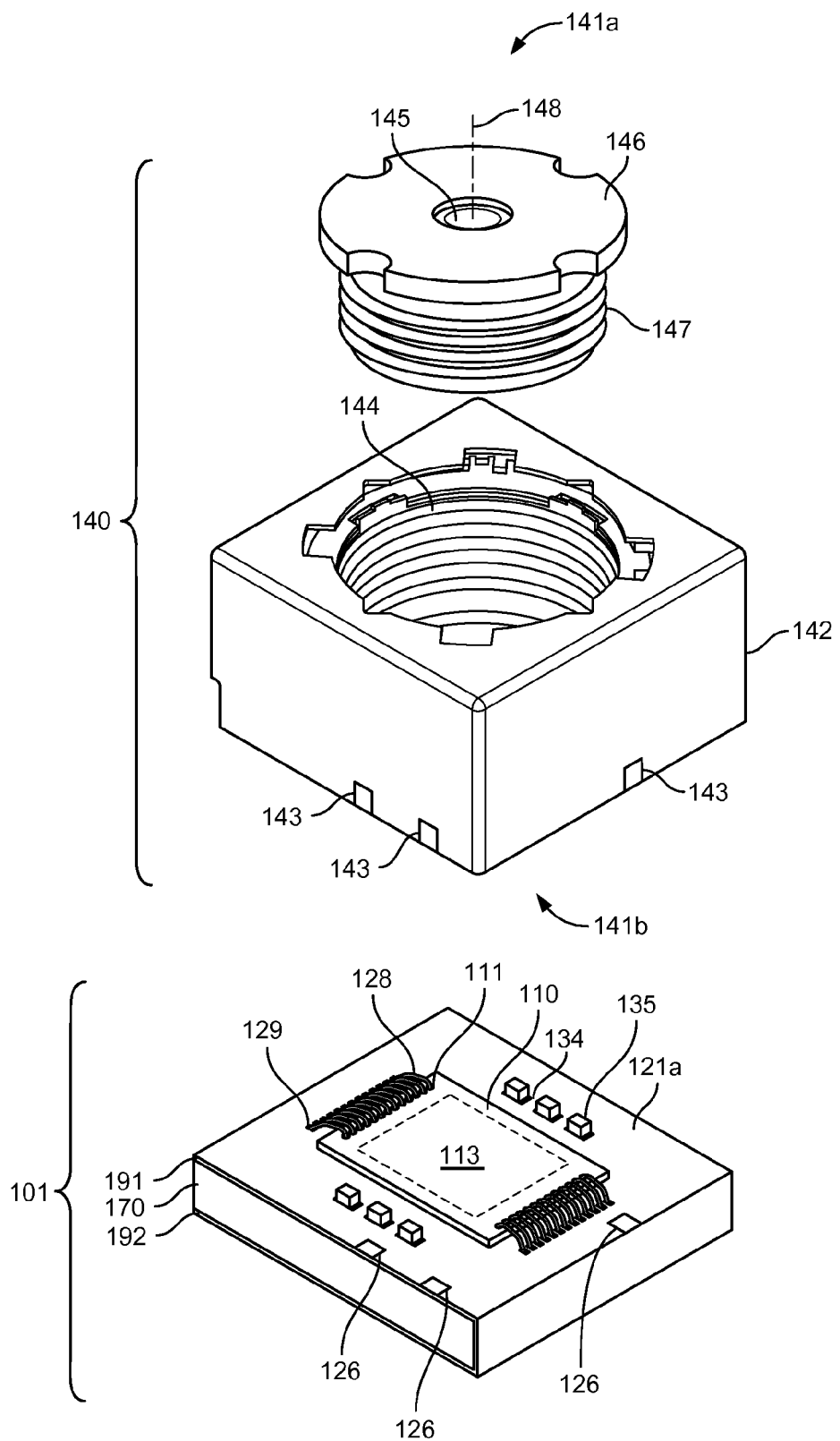
FIG. 1 is an exploded perspective view of a camera module, in accordance with embodiments of the present invention.
Figure 4:
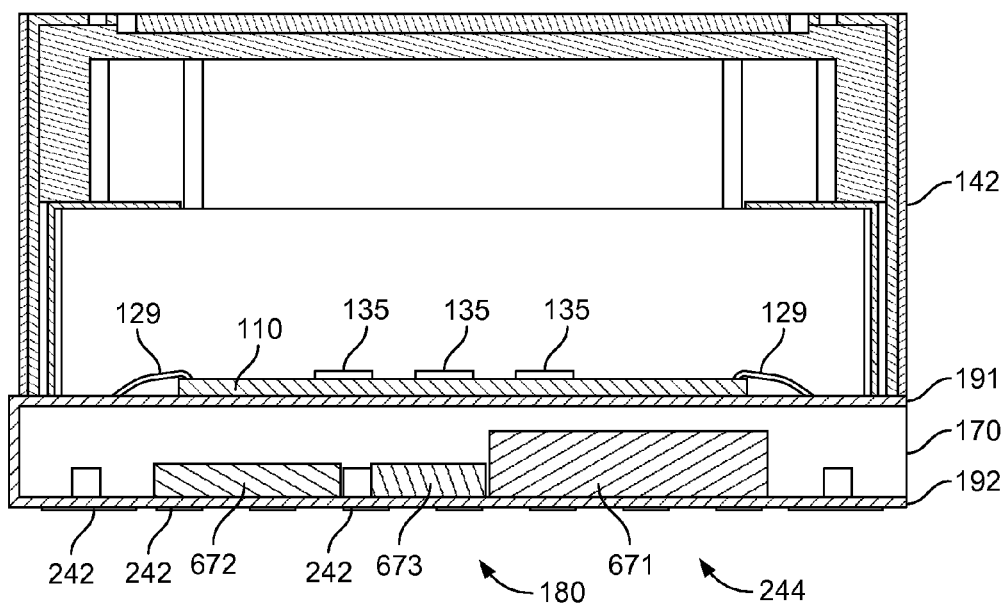
FIG. 4 is a cross-sectional view of a camera module, in accordance with embodiments of the present invention.

FIG. 1 is an exploded perspective view of a camera module 100 with a flexible substrate wrapped around a molded enclosure, in accordance with embodiments of the present invention. FIG. 4 is a cross-sectional view of the camera module 100.

The camera module 100 comprises an image sensor module 101 and a lens module 140. The image sensor module 101 comprises an image sensor die 110, an optical filter (not shown), a substrate 120, and electronic components 135.

The lens module 140 comprises an autofocus lens housing 142 forming a cavity containing one or more lenses 145 which are supported by a lens barrel 146. The lens barrel 146 includes a threaded section 147 and is received in a corresponding lens barrel 144, which is driven by motors or actuators in the lens housing 120 to rotate, thereby translating the lens barrel 146 up and down along optical axis 148. The lens module 140 may utilize voice coil motors (VCM) to move the lens barrel 146 along the optical axis 148 of the camera. The VCM may also drive lateral movement of the lens barrel 146 orthogonal to the optical axis 148 in order to provide optical image stabilization to compensate for shaking or other movement of the camera. Alternatively, microelectromechanical systems (MEMS) actuators may be used to translate the lenses 145. A variety of camera modules, including a variety of multi-lens autofocus camera modules, are commercially available and may be utilized in accordance with various embodiments of the present invention.

The lens module 140 comprises an image receiving side 141a and an image sensor side 141b. The image receiving side 141a faces the object being photographed when the camera module 100 is in use. The image sensor side 141b faces the image sensor die 110.

The substrate 120 may comprise any form of circuit substrate suitable to provide the necessary interconnection structure for operation of the camera module 100, as is well known in the art. The substrate 120 may comprise, for example, a flexible substrate, such as a flexible high density interconnect (HDI) tape substrate, which is available in very thin configurations. The HDI tape substrate may comprise a multilayer interconnect structure using polyimide as a dielectric and electroplated copper conductor lines, The flexible substrate 120 may comprise a flexible base material comprising, e.g., polyester, polyimide, polyethylene naphthalate, or polyetherimide, and conductive layers comprising, e.g., conductive metal foil, electroplated copper, screen printing metal circuits, or other conductive materials. Alternatively, the flexible substrate 120 may comprise a rigid flex substrate having one or more interconnect and dielectric layers.

The flexible substrate 120 may comprise a single body that extends over the top and bottom sides of an enclosure 170 and comprises a first portion 191 which is positioned on top of the enclosure 170 adjacent to the image sensor side 141b of the lens module 140, a second portion 192 which is positioned on the bottom of the enclosure 170 opposite the first portion 191, and a third portion 193 which is positioned on the side of the enclosure 170 to couple the first portion 191 and the second portion 192.

The first portion 191 includes a plurality of substrate-sensor contacts 129. The image sensor die 110 includes a plurality of output die contacts 111 formed along one or more edges of the image sensor die 110. The output die contacts 111 are coupled to the substrate-sensor contacts 129, as will be described in greater detail below.

In the illustrated embodiment, the first portion 191 of the substrate 120 includes a plurality of component contacts 134 for coupling with the electronic components 135. The electronic components 135 may include passive and/or active components for processing the output signals from the image sensor. The passive components may include inductors, capacitors, or resistors. The electronic components 135 are coupled to the component contacts 134 formed on the substrate 120, thereby electrically coupling the passive components 135 with the image sensor die 110 via the substrate-sensor contacts 129.

The second portion 192 of the substrate 120 includes a second plurality of component contacts 136 for coupling with the image stabilization components 180 (not shown in FIG. 1), as will be described in greater detail below.

The second portion 192 of the flexible substrate 120 further includes a main board contact region 244 (shown in FIG. 4). The main board contact region 244 includes a plurality of LGA pads 242 which may be coupled to main board contacts on the main board of the electronic device. The LGA pads 242 receive all of the power and I/O signals required for operation of the camera module 100. The LGA pads 242 can be bonded (e.g., soldered) directly to corresponding contacts on the main board, coupled to an LGA socket mounted to the main board, or coupled to another intermediate interposer structure, such as a cable or circuit board, which is coupled to the main board.

The image sensor die 110 includes a photosensor portion 113 comprising any type of image capturing element that converts an optical image into an electronic signal, such as, e.g., a charge-coupled device (CCD) or complementary metal-oxide-semiconductor (CMOS) active pixel sensor.

An optical filter (not shown) may be used to improve the quality of the images generated by the camera module. The optical filter may be used for filtering undesirable wavelengths of light, such as infrared light, received by the lens module 140 to prevent the light from reaching the photosensor portion 113 of the image sensor die 110, which could degrade the quality of digital image generated. In other embodiments, other types of optical filters may be used, such as, for example, a blue or other color filter, or a polarizing filter. The optical filter may be positioned in a variety of locations within the camera module 100. For instance, a spacer member may be coupled to the upper side 121a of the flexible substrate 120 around the image sensor die 110. The spacer member may be used to support the optical filter above the image sensor die 110 and bond wires 128 coupling the image sensor die 110 to the flexible substrate 120. In other embodiments, the optical filter may be coupled to the lens housing 142.

The camera module 100 may be incorporated into any of a variety of electronic devices. FIGS. 2A-2B illustrate front and back views, respectively, of an example portable computing device 200 that may incorporate a camera module in accordance with various embodiments described herein. Although one example of an electronic device is shown, it should be understood that various other types of electronic devices that are capable of incorporating digital camera functionality can be used in accordance with various embodiments discussed herein. The electronic devices can include, for example, smartphones, electronic book readers, tablet computers, notebook computers, personal data assistants, cellular phones, video gaming consoles or controllers, television set top boxes, and portable media players, among others.

In this example, the portable computing device 200 has a display 202 (e.g., a liquid crystal display (LCD) element) operable to display image content to one or more users or viewers of the device. In at least some embodiments, the display screen provides for touch or swipe-based input using, for example, capacitive or resistive touch technology.

FIG. 3 is an example block diagram illustrating basic components of a computing device, such as computing device 200. In this example, the device 200 includes at least one processor 202 for executing instructions that can be stored in at least one memory device 204. As would be apparent to one of ordinary skill in the art, the memory device 204 can include one or more different types of memory, data storage or computer-readable storage media, such as, for example, a first data storage for program instructions for execution by the processor 202, a second data storage for images or data and/or a removable storage for transferring data to other devices.

The computing device 200 includes one or more camera modules 100 configured to capture an image of people or objects in the vicinity of the device 200. The computing device 200 may include a main board, which may be the primary circuit board for the computing device 200 onto which one or more of the following components may be mounted. The camera module 100 includes a circuit substrate 120 which may be electrically coupled to the main board of the computing device 200 in a variety of ways, such as by direct mounting to the main board or with an interposer, which serves as an intermediate coupling device providing an electrical interface between the circuit substrate 120 and the main board. The interposer may comprise, for example, a cable or a rigid or flexible circuit board having interfaces coupled to the circuit substrate 120 and the main board, as will be described in greater detail below.

The computing device 200 includes a display element 206 for displaying images using technologies such as, for example, electronic ink (e-ink), organic light emitting diode (OLED) or liquid crystal display (LCD). The computing device 200 may also include an audio element 210, such as one or more audio speakers 211 and/or audio capture elements capable of capturing audio data, such as microphones 213. The computing device 100 may also include a positioning element 212, such as motion, position or orientation determining element 215, that provides information such as a position, direction, motion, or orientation of the device 200. The computing device 200 can include one or more input elements 218 operable to receive inputs from a user. The input elements 218 can include, for example, a push button, touch pad, touch screen, wheel, joystick, keyboard, mouse, trackball, keypad or any other such device or element whereby a user can provide inputs to the computing device 200. The computing device 200 may also include at least one communication interface 214, comprising one or more wireless components operable to communicate with one or more separate devices within a communication range of the particular wireless protocol. The wireless protocol can be any appropriate protocol used to enable devices to communicate wirelessly, such as Bluetooth, cellular, or IEEE 802.11. It should be understood that the computing device 200 may also include one or more wired communications interfaces for coupling and communicating with other devices. The computing device 200 may also include a power supply 216, such as, for example, a rechargeable battery operable to be recharged through conventional plug-in approaches, or through other approaches such as capacitive charging.

Figure 5:
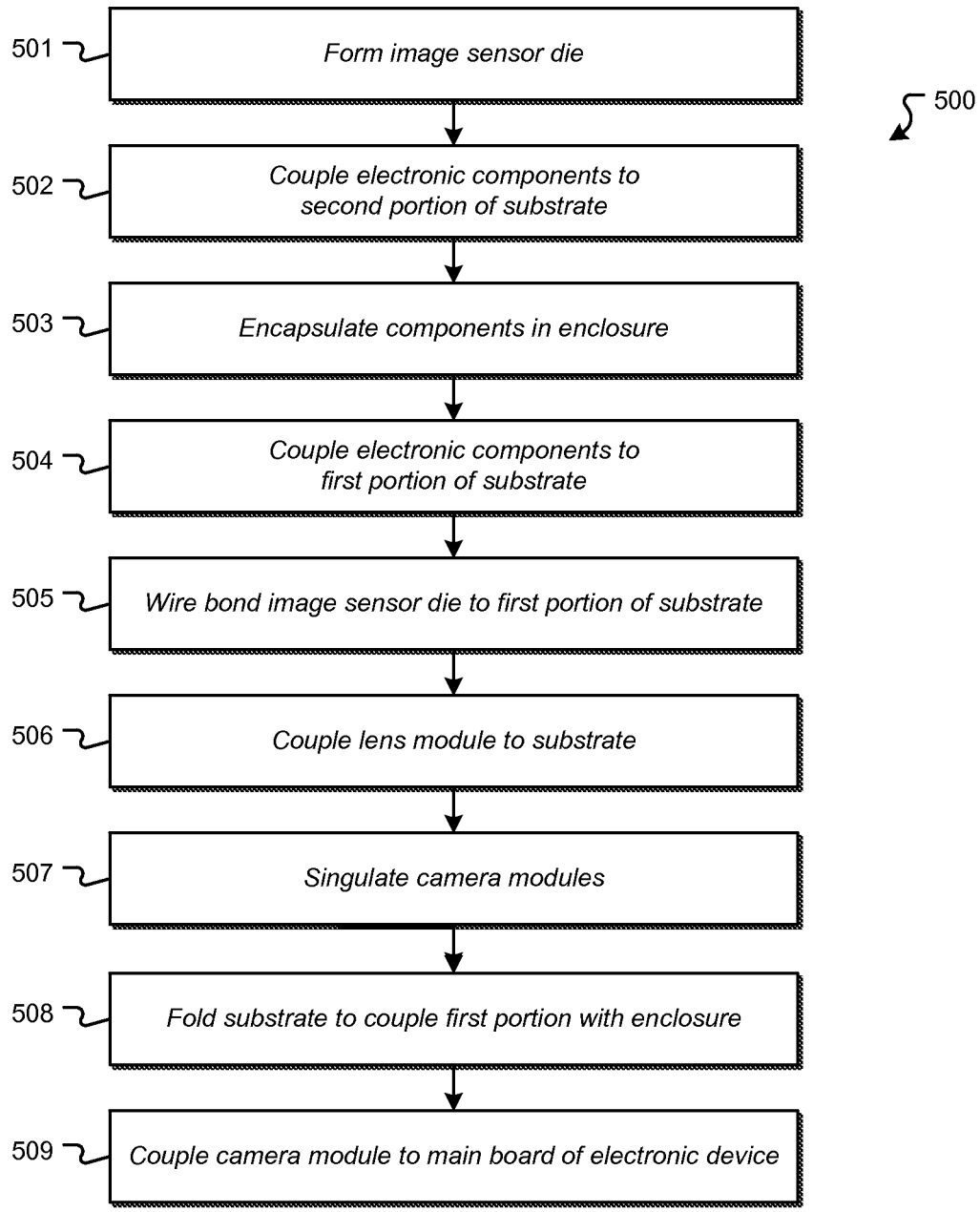
FIG. 5 is a flowchart illustrating a method of manufacturing a camera module with a flexible substrate folded over a molded enclosure, in accordance with embodiments of the present invention.

FIG. 5 is a flowchart illustrating a method 500 of manufacturing a camera module 100 with a flexible substrate folded over a molded enclosure, in accordance with embodiments of the present invention. FIGS. 6A-6G illustrate various steps in the manufacturing method 500.

Figure 6A:
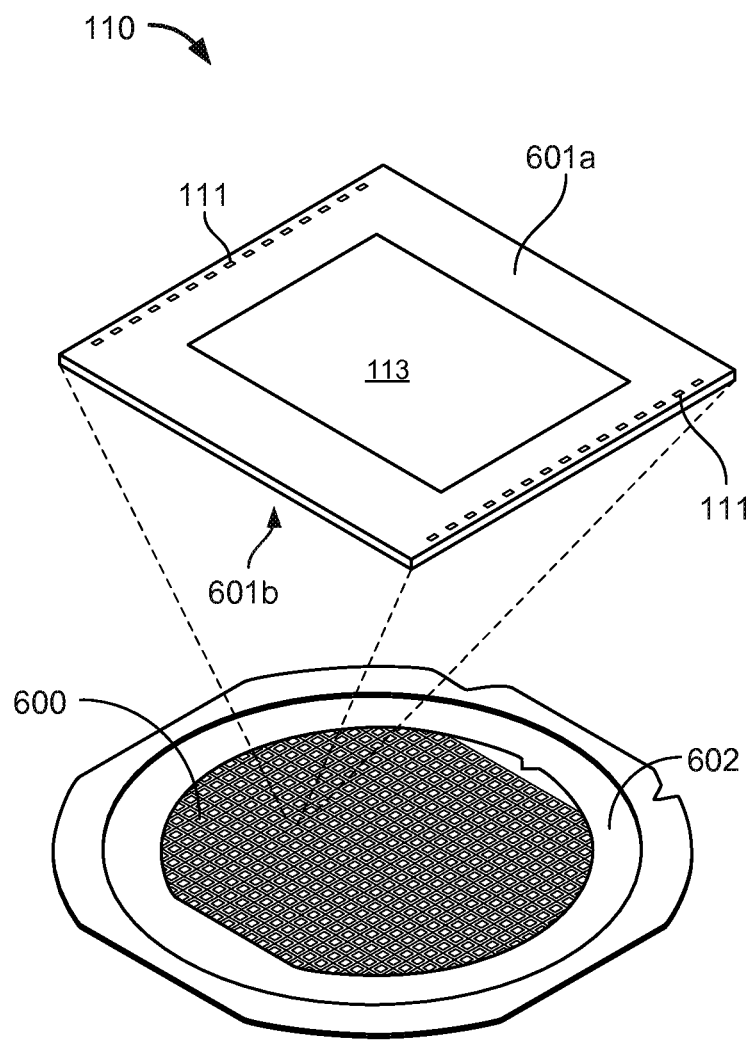
FIGS. 6A-6G illustrate various steps in the manufacturing process illustrated in FIG. 5.

In step 501, shown in FIG. 6A, the image sensor die 110 is formed. Before each image sensor die 110 is singulated or diced from the wafer 600 held in the wafer carrier 602, a plurality of die contacts 111 are formed on the upper surface 601a of each image sensor die 110. The die contacts 111 can be formed in a variety of ways, depending on the desired method of coupling the image sensor die 110 to the substrate 120. In some embodiments, the die contacts 111 on the image sensor die 110 may be used for wire bonding with the substrate 120. The die contacts 111 may be formed using any of a variety of well-known techniques, such as, for example, using ball bonds. In other embodiments, the die contacts 111 on the image sensor die 110 may be used for flip chip bonding with the substrate 120, in which case, the die contacts 111 may comprise gold stud bumps. Alternatively, the die contacts 111 may comprise any other type of suitable material and form, such as, e.g., sputter plated bumps, gold plated bumps, or copper pillar bumps.

Figure 6B:
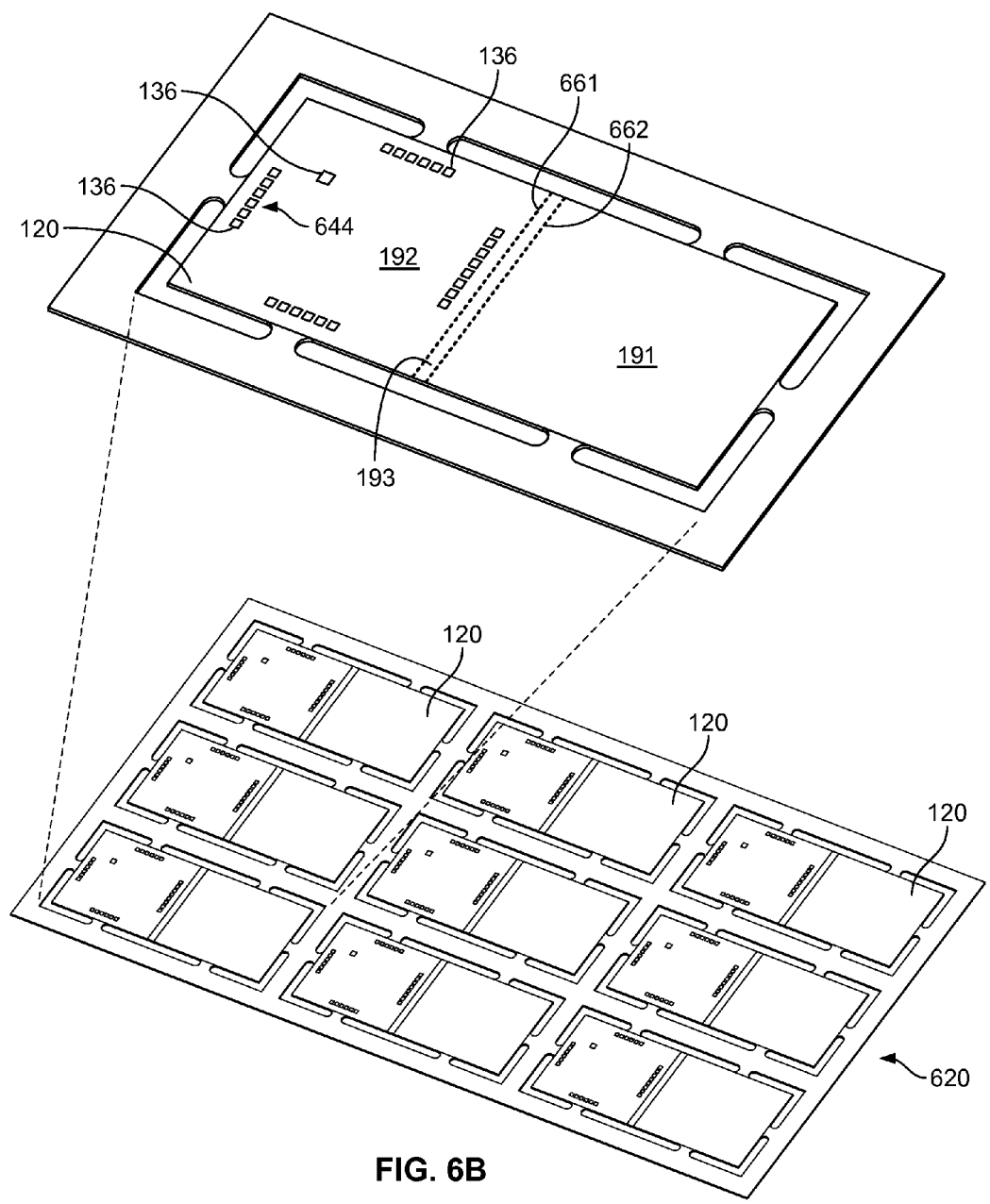
Figure 6C:
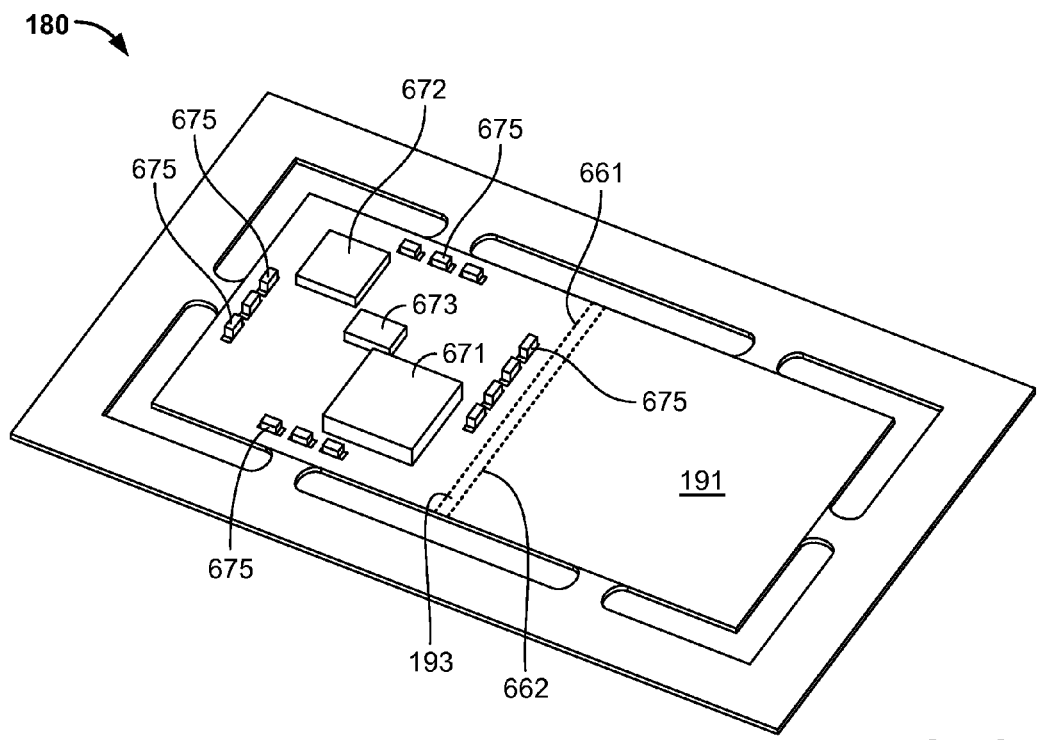

In step 502, shown in FIGS. 6B-6C, a plurality of substrates 120 are provided in a substrate strip array 620 and electronic components are coupled to the second portion 192 of the substrate 120.

FIG. 6B is a perspective view of the interior side of the substrate 120. As will be described in greater detail below, the substrate 120 will be folded to wrap around the enclosure 170. The interior side of the substrate 120 will face the enclosure 170 and the exterior side (shown in FIG. 6E) will be exposed for coupling with the lens module 140 and the main board of the electronic device into which the camera module 100 is integrated.

Fold lines 661, 662 are shown for illustrative purposes to indicate where the substrate 120 will be folded when coupled to the enclosure 170. In some embodiments, fold lines 661, 662 correspond to mechanical features in the substrate 120 for facilitating the folding of the substrate 120, such as a scoring line. In other embodiments, the fold lines 661, 662 do not represent any physical features and are merely illustrative of the location of a later folding step.

As shown in FIG. 6B, the interior side of each substrate 120 includes a plurality of component contacts 136. Electronic components (shown in FIG. 6C) may be coupled to each of these contacts 136 using, e.g., surface mount technology (SMT). The various contacts provided on the substrate 120 may be formed, e.g., using electroless nickel immersion gold (ENIG) plating techniques. ENIG is an electroless nickel layer capped with a thin layer of immersion gold, which provides a multifunctional surface finish. The immersion gold protects the underlying nickel from oxidation/passivation.

The electronic components mounted to the second portion 192 of the substrate 120 may comprise image stabilization components 180 used to provide an optical image stabilization (OIS) functionality for the camera module 100. These image stabilization components 180 may comprise, for example, a gyroscopic sensor 671, a memory 672, an optical image stabilization logic module 673, and passive electronic components 675. The gyroscopic sensor 671 may comprise one or more sensors for sensing movement along one or more axes. In some embodiments, the gyroscopic sensor 671 may sense movement along two axes, thereby enabling correction for pitch and yaw axis rotations. The memory 672 may comprise a non-volatile EPROM memory for storing the firmware instructions for the operation of the OIS functionality. The optical image stabilization logic module 673 may comprise a controller with logic for executing the OIS functionality. The image stabilization components 180 may be mounted to the substrate 120 using any suitable manufacturing technique, such as the SMT mounting process described above.

Figure 6D:
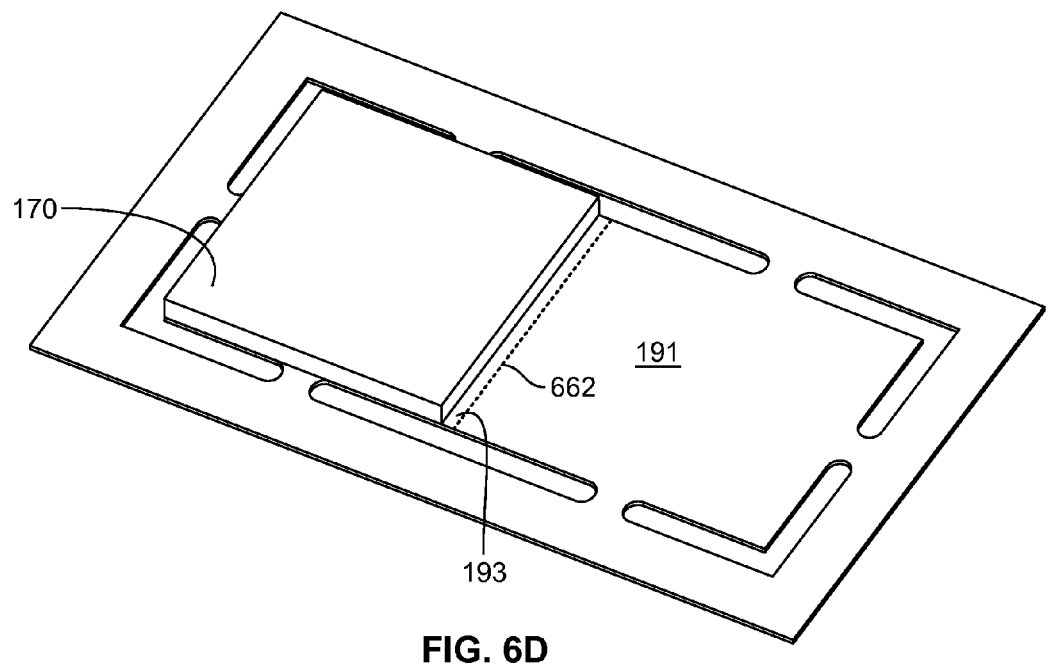

In step 503, shown in FIG. 6D, the image stabilization components 180 are encapsulated in an enclosure 170. In some embodiments, the enclosure 170 comprises any of a variety of transfer molding materials well-known in the semiconductor packaging industry. The transfer molding material may comprise a resin with a hardener, accelerator, fillers, flame retardants, and other modifiers, such as an epoxy resin with a silica filler. In the illustrated embodiment, the molded enclosure 170 serves to protect the image stabilization components 180 and to provide a flat surface for bonding with the first portion 191 of the substrate 120. The transfer molding material can be advantageous in this application because its manufacturing processes are well known and relatively inexpensive, and its physical characteristics are well documented. In other embodiments, the enclosure 170 may comprise another material. A rigid enclosure 170 comprising, e.g., a metal or polymer, may be formed prior to attachment to the substrate 120, and may be attached to the substrate 120 to enclose the image stabilization components 180. In some embodiments, a grounded metal enclosure 170 may advantageously provide RF shielding and isolation for the electronic components contained therein.

Figure 6E:
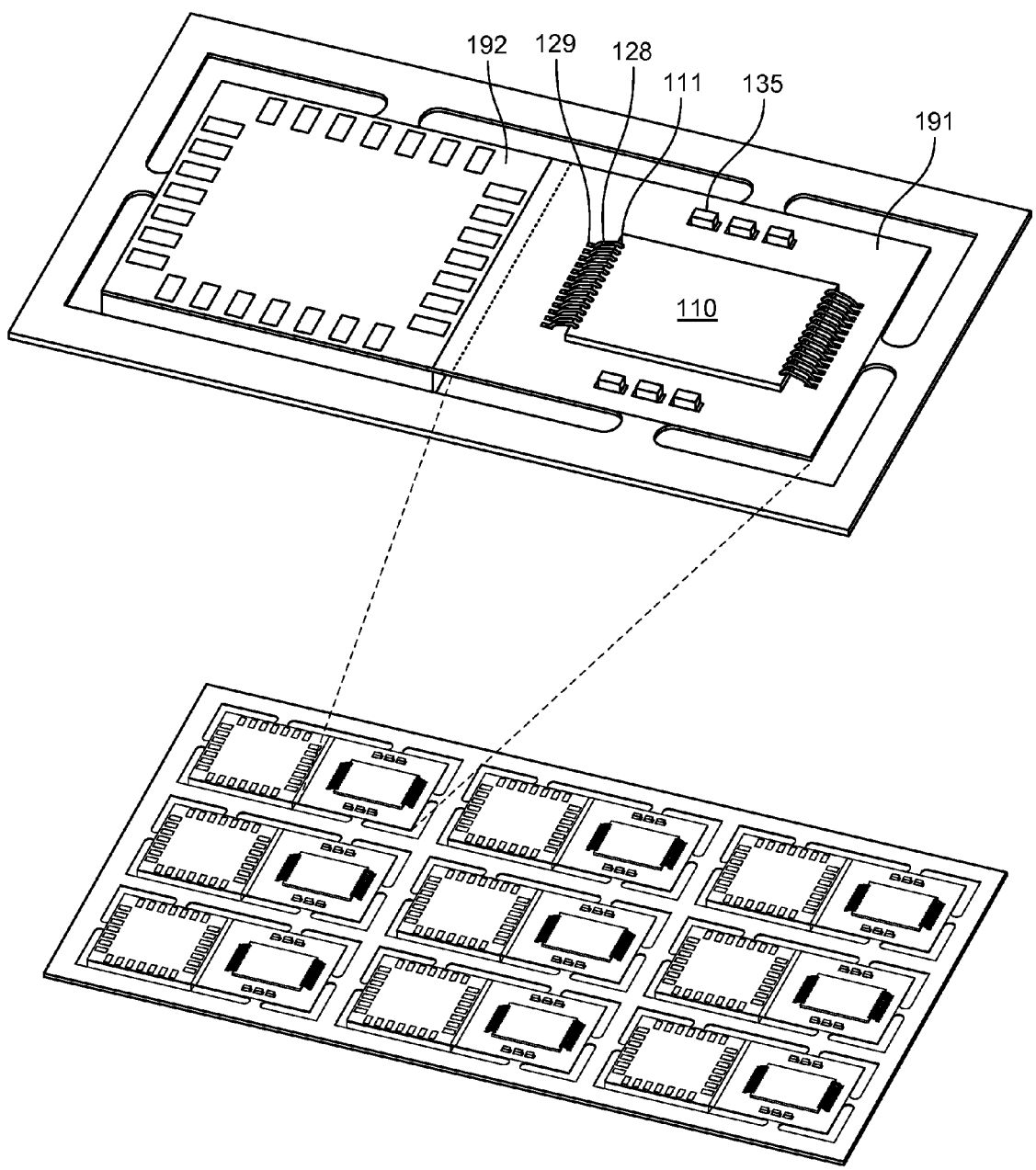

In step 504, shown in FIG. 6E, additional electronic components 135 are coupled to the first portion 191 of the substrate 120 using, e.g., SMT processes. FIG. 6E shows a perspective view of the exterior side of the substrate 120. The exterior side of the first portion 191 of the substrate 191 includes a plurality of component contacts 134 for coupling with additional components 135. In accordance with some embodiments of the present invention, the electronic components 135 on the first portion 191 of the substrate 120 comprise decoupling capacitors that are coupled to the substrate 120 along the two sides of the image sensor die 110 not used for wire bonding of the die 110 to the substrate 120. As a result, the decoupling capacitor passive components 135 may be placed as close as possible to the image sensor die 110, thereby improving the image signal from the die 110. Other passive components 675 that do not require close proximity to the image sensor die 110 or that require close proximity to the other image stabilization components 180, such as the gyroscopic sensor 671 and optical image stabilization logic module 673, may be coupled to the second portion 192 of the substrate 120.

In step 505, shown in FIG. 6E, the image sensor die 110 is attached to the exterior side of the first portion 191 of the substrate 120, using, for example, an epoxy adhesive, and the die contacts 111 on the upper surface of each image sensor die 110 are wire bonded to substrate-sensor contacts 129 on the upper surface of the flexible substrate 120. Each of the die contacts 111 is coupled to a respective one of the substrate-sensor contacts 129 using a bond wire 128, e.g., a gold bond wire, which extends across the gap separating the flexible substrate 120 and the image sensor die 110.

Figure 6F:
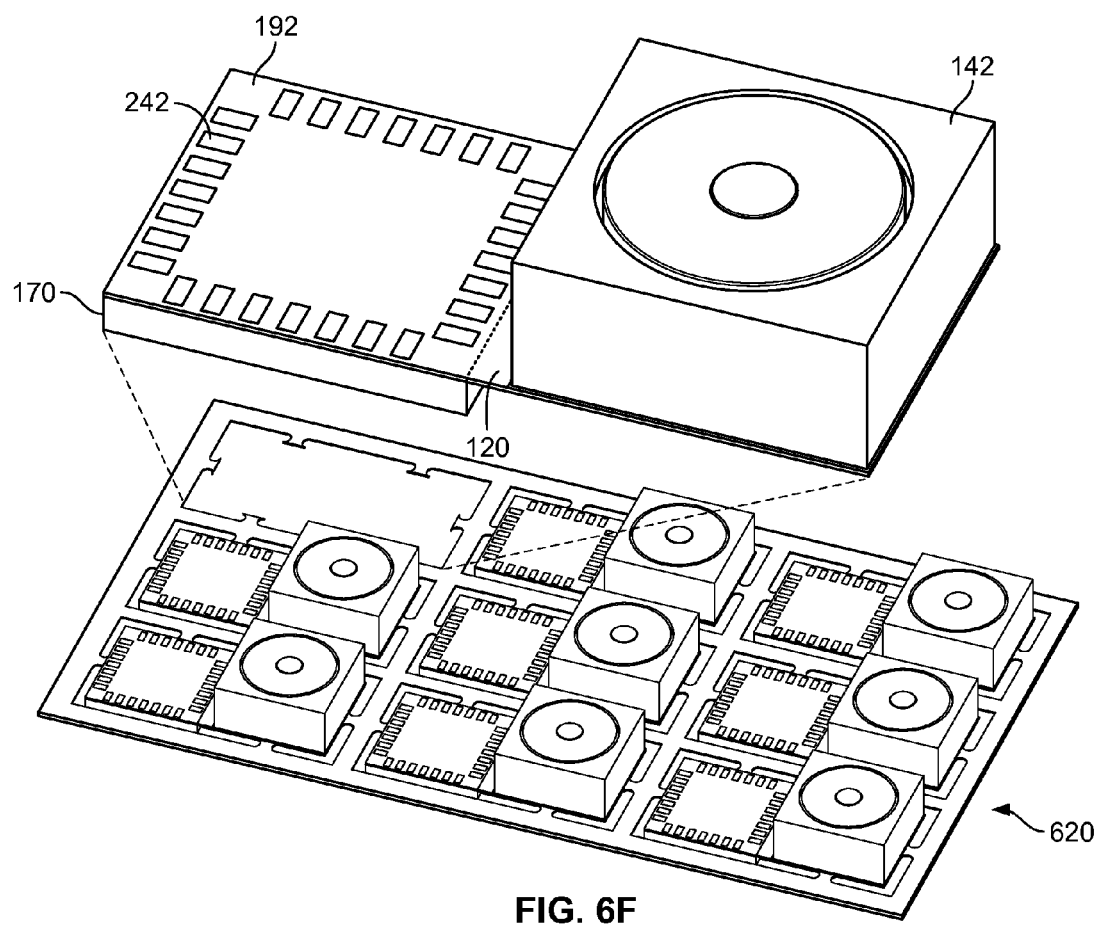

In step 506, shown in FIG. 6F, a lens housing 142 is coupled to the exterior side of the first portion 191 of each of the substrate assemblies 120 in the substrate strip array 620. The lens housing 142 may be attached to the substrate 120 by depositing an adhesive, such as an epoxy adhesive, onto a portion of the substrate 120 not otherwise used for electrical connections. The lens module connections 126 (shown in FIG. 6E) on the substrate 120 may then be coupled to the corresponding contacts 143 in the lens housing 142 using, for example, conventional soldering methods. These lens module connections 126 may be used to provide power, ground, and control signals to the lens module 140.

In step 507, each camera module 100 may then be singulated from the strip array 620. In some embodiments, the substrate assemblies 120 may be singulated from the strip array 620 prior to attachment of the lens housings 142. However, in other embodiments, it is desirable to attach the lens housings 142 to each of the substrates 120 prior to singulation from the array 620. This bulk processing can result in an improvement in the manufacturing units per hour (UPH). In addition, after the lens housings 142 are attached, the strip array 620 may be coupled to a test fixture which establishes electrical connections with each of the camera modules 100 in the array 620. This can enable the test fixture to power up and test each of the camera modules 100 prior to singulation. During this testing, an active alignment process may be performed to ensure that the optical path through the lenses 145 is accurately aligned with the image sensor die 110. The active alignment process can measure the optical characteristics of the lenses 145 and image sensor die 110 and adjust the alignment in up to five degrees of freedom. By attaching the lens housing 142 and performing the active alignment process prior to singulation, the testing and alignment can be performed in a batch process, thereby improving UPH.

Figure 6G:
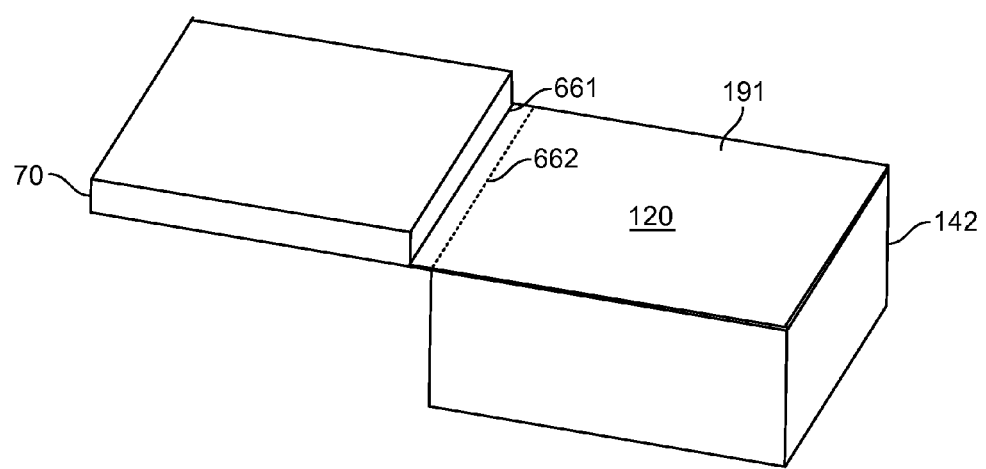
Figure 7A:
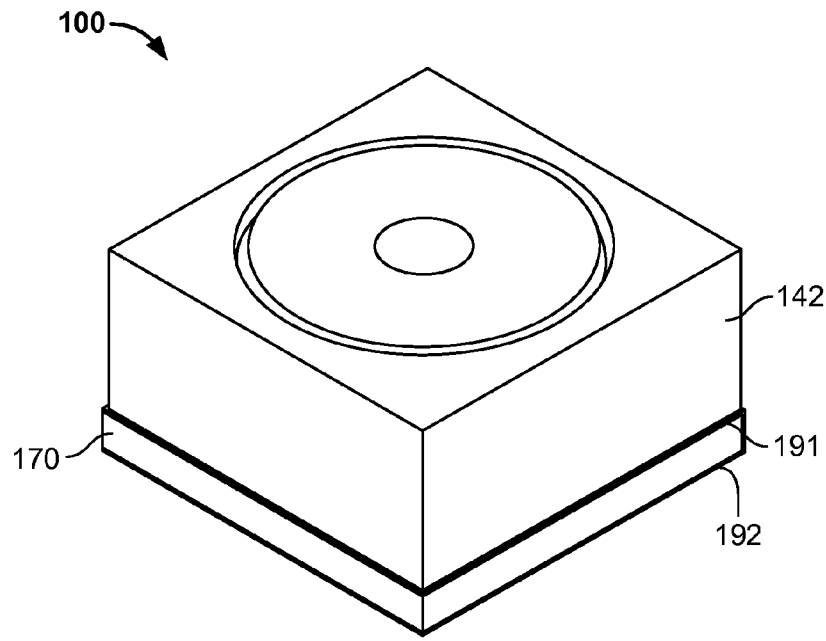
FIGS. 7A-7B illustrate perspective views of a camera module, in accordance with embodiments of the present invention.

In step 508, the interior side of the first portion 191 of the substrate 120 is coupled with the molded enclosure 170. This can be accomplished by depositing an adhesive to either or both the enclosure 170 and the interior side of the substrate 120, as shown in FIG. 6G. Next, the substrate 120 is folded along fold lines 661, 662 to press the enclosure 170 against the interior side of the first portion 191 of the substrate, as shown in FIG. 7A. Any of a variety of known adhesives may be used to couple the enclosure 170 to the substrate 120. In some embodiments, the lens housing 140 may comprise stainless steel, in which case an adhesive suitable for bonding a transfer mold compound with the substrate material of the substrate 120, such as, for example, solder.

Figure 7B:
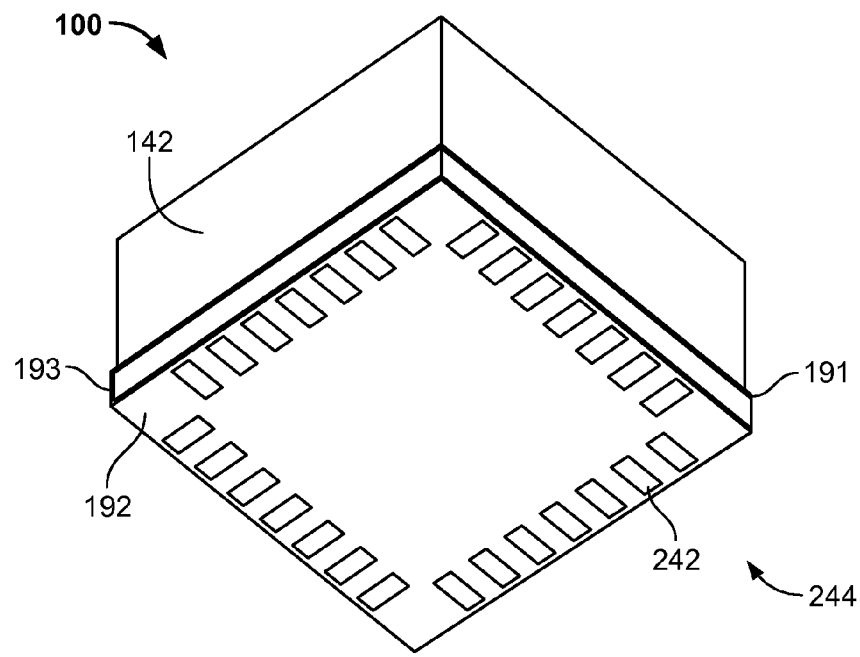

FIGS. 7A-7B show top and bottom perspective views, respectively, of the completed camera module 100. As shown in FIG. 7B, the interior side of the second portion 192 of the substrate 120 is exposed on the bottom of the camera module 100. This exposed portion of the substrate 120 includes a main board contact region 244 comprising a plurality of main board contacts 242, e.g., LGA pads 242. When the camera module 100 is integrated into an electronic device, such as computing device 200, the LGA pads 242 may be coupled to main board contacts on the main board of the electronic device.

In step 509, the camera module 100 is coupled to the main board of the electronic device to form a completed camera assembly. This may be accomplished using any of a variety of known methods. In the illustrated embodiment, the LGA pads 242 are provided along a peripheral edge of the exterior side of the second portion 192 of the substrate 120. This arrangement can improve the manufacturability of the camera module 100 by permitting easy access to the LGA pads 242 for reworking if one of the soldering bonds between the PGA pads 242 and the main board contacts fails.

Figure 8:
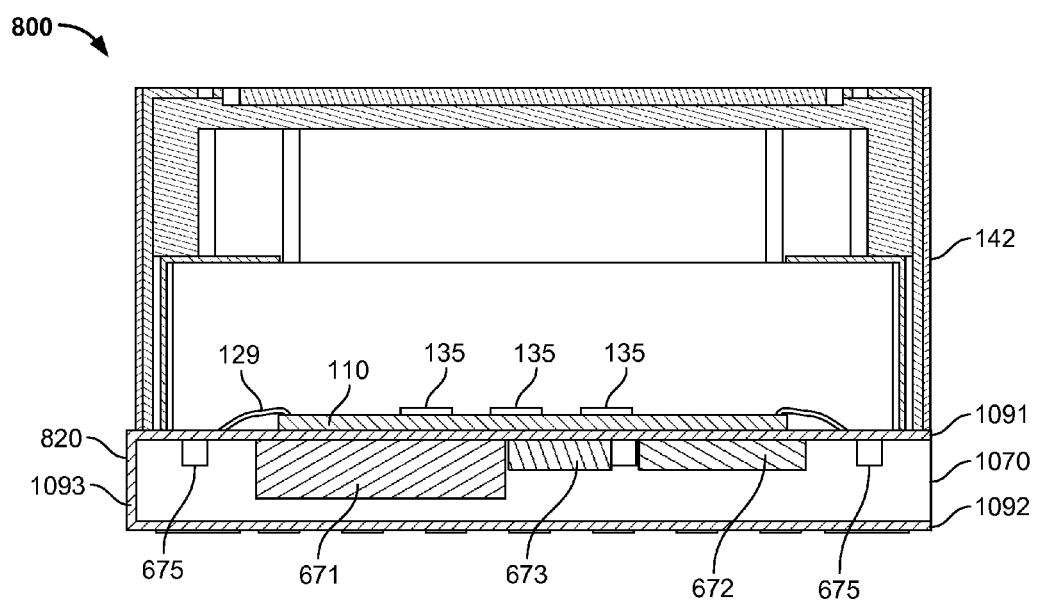
FIG. 8 is a cross-sectional view of a camera module, in accordance with other embodiments of the present invention.

FIG. 8 is a cross-sectional view of a camera module 800, in accordance with other embodiments of the present invention. The camera module 800 is similar to the camera module 100 described above, except that the image stabilization components are coupled to the interior side of the first portion of the substrate 820, instead of to the second portion of the substrate 120, as in camera module 100.

Figure 9:
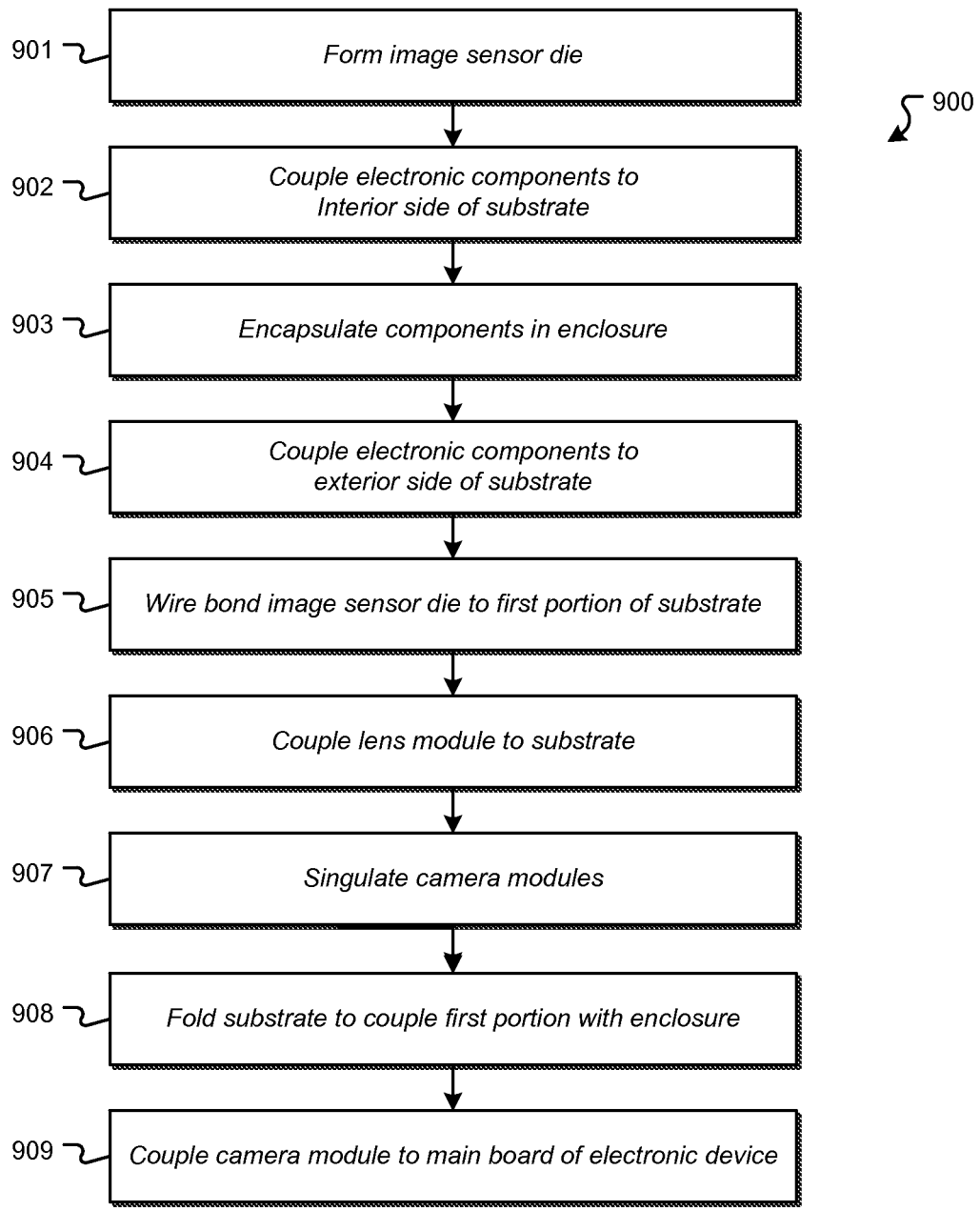
FIG. 9 is a flowchart illustrating a method of manufacturing a camera module of FIG. 8, in accordance with embodiments of the present invention.

FIG. 9 is a flowchart illustrating a method 900 of manufacturing the camera module 800 with a flexible substrate folded over a molded enclosure, in accordance with embodiments of the present invention. FIGS. 10A-10G illustrate various steps in the manufacturing method 900.

In step 901, the image sensor die 110 is formed.

Figure 10A:
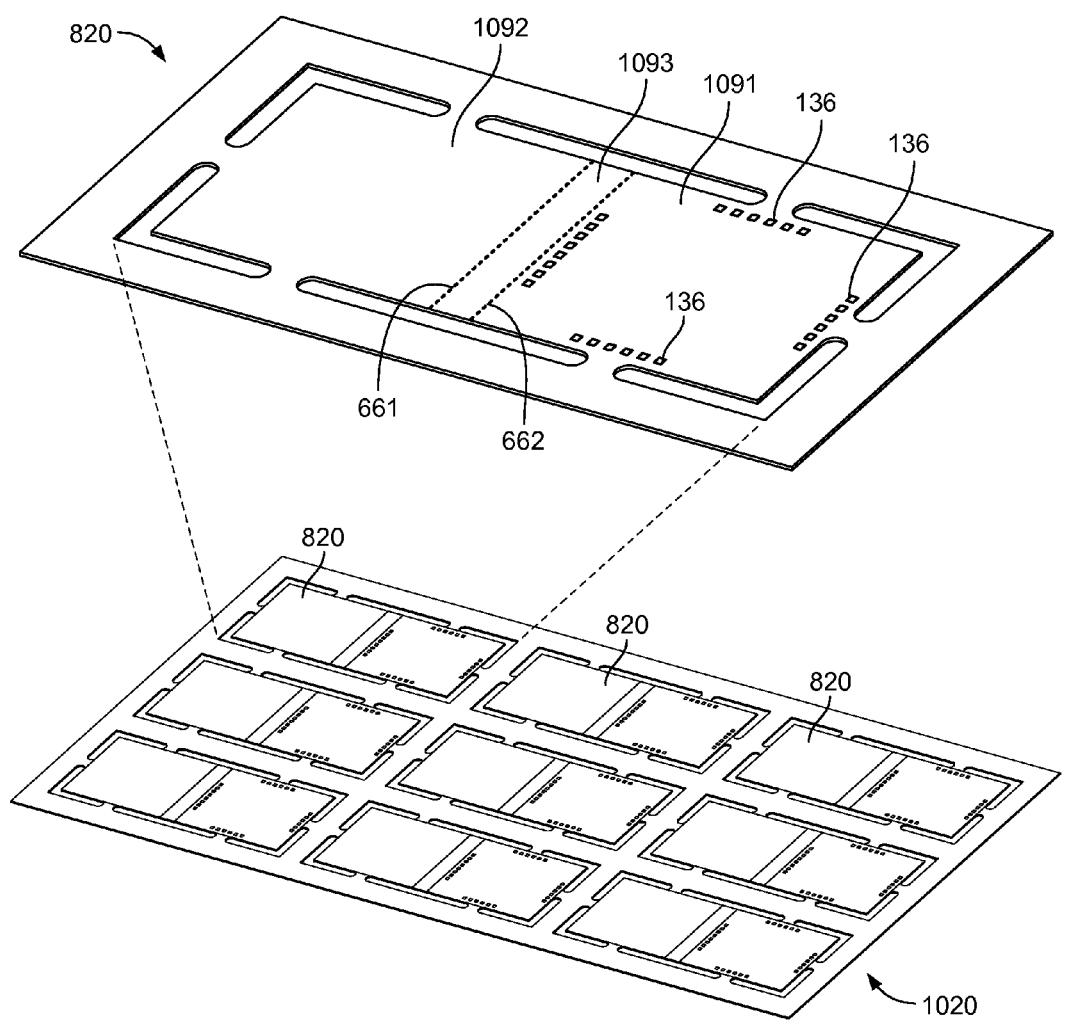
FIGS. 10A-10F illustrate various steps in the manufacturing process illustrated in FIG. 9.
Figure 10B:
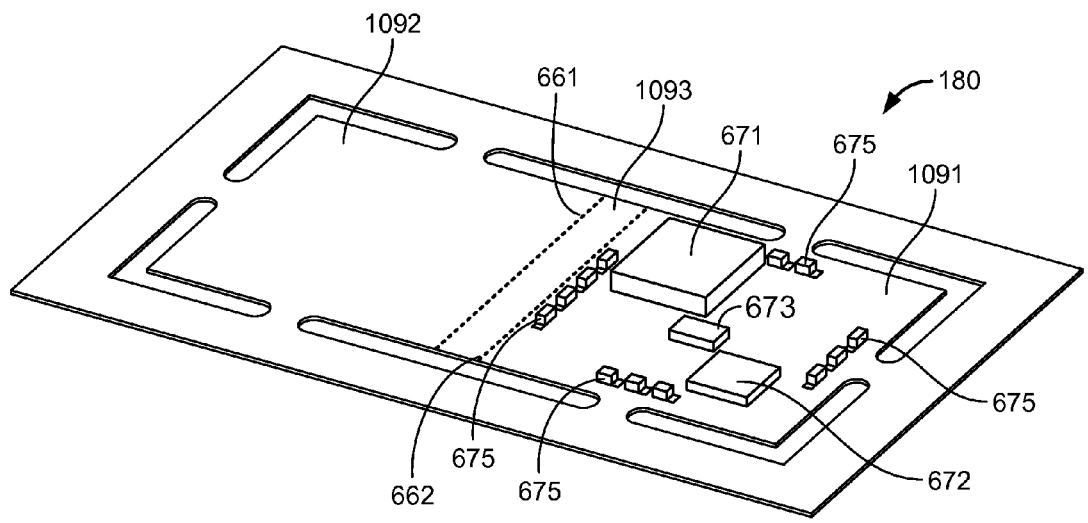

In step 902, shown in FIGS. 10A-10B, a plurality of substrates 820 are provided in a substrate strip array 1020 and electronic components are coupled to the interior side of the first portion 1091 of the substrate 820. FIG. 10A is a perspective view of the interior side of the substrate 820 before the components are attached, and FIG. 10B is a perspective view of the interior side of the substrate 820 after the components are attached.

As shown in FIG. 10A, the interior side of each substrate 820 includes a plurality of component contacts 136. However, unlike the contacts 136 in the substrate 120 shown in FIG. 6B, the contacts 136 in FIG. 10A are formed on the first portion 1091 of the substrate 820. The electronic components mounted to the first portion 191 of the substrate 820 may comprise image stabilization components 180, similar to those described above with respect to FIG. 6C.

Figure 10C:
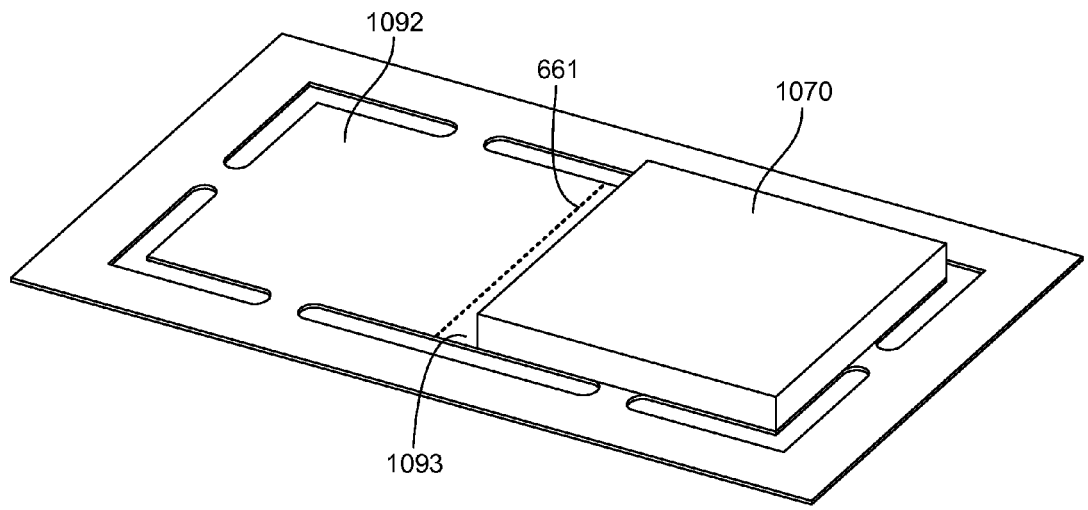

In step 903, shown in FIG. 10C, the image stabilization components 180 are encapsulated in an enclosure 1070. The enclosure 1070 is similar to the enclosure 170 described above, except that it is formed on the first portion 1091 of the substrate 820.

Figure 10D:
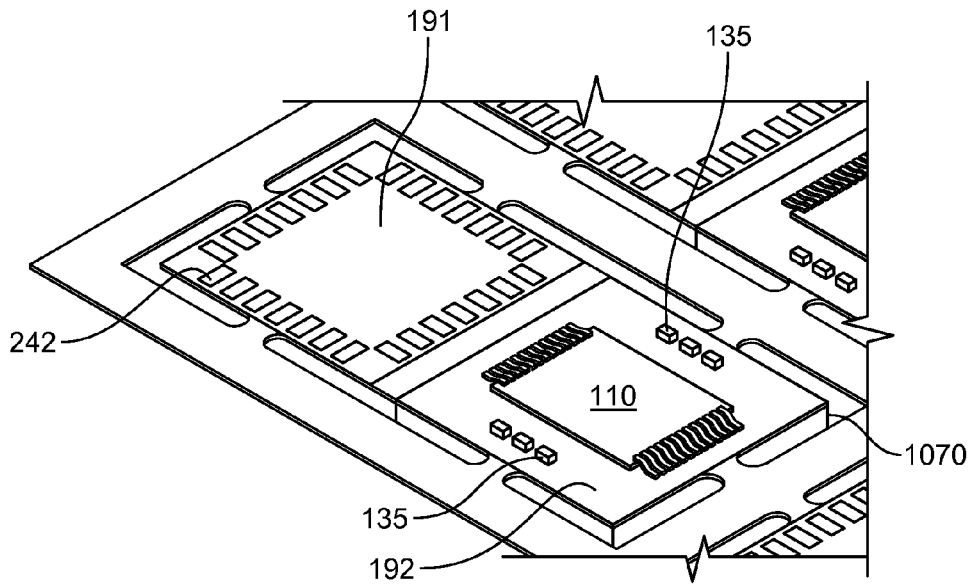

In step 904, additional electronic components 135 are coupled to the exterior side of the first portion 1091 of the substrate 820. FIG. 10D shows a perspective view of the exterior side of the substrate 820.

In step 905, shown in FIG. 10D, the image sensor die 110 is coupled to the exterior side of the first portion 1091 of the substrate 820 and the die contacts 111 on the upper surface of each image sensor die 110 are wire bonded to substrate-sensor contacts 129 on the upper surface of the substrate 820.

Figure 10E:
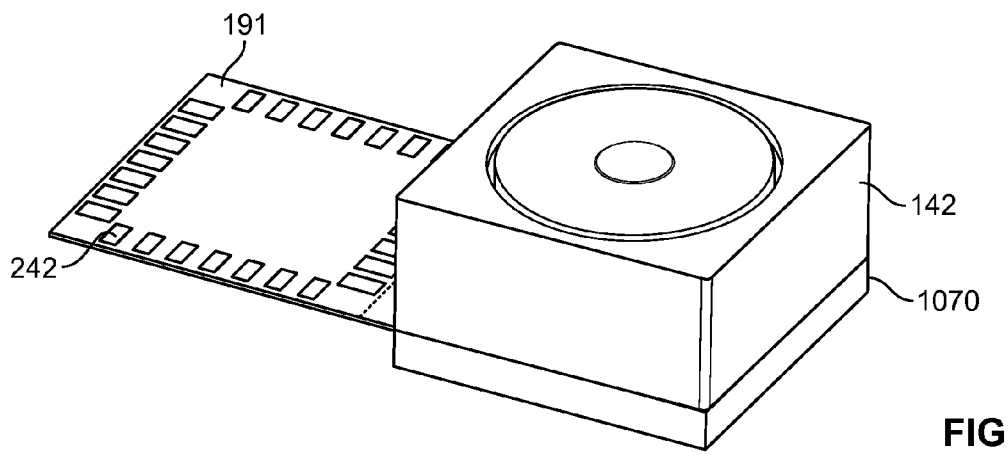
Figure 10F:
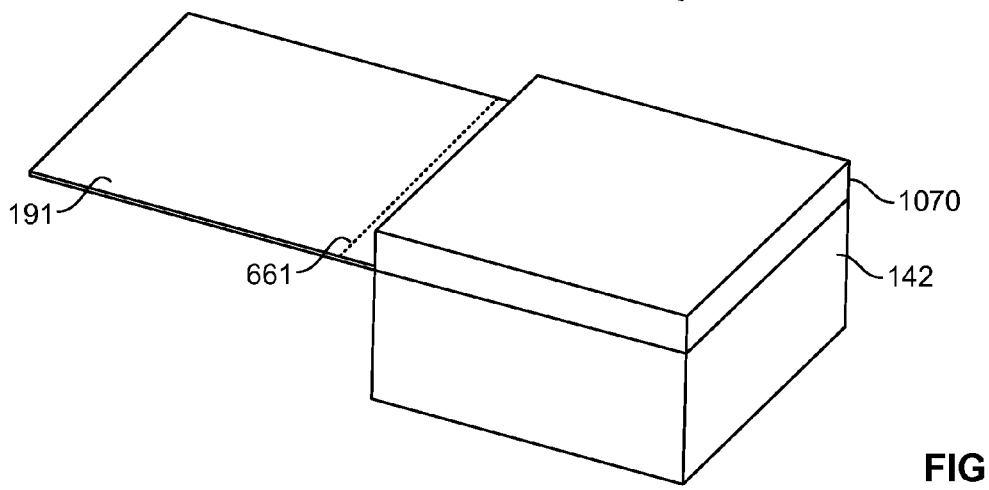

In step 906, shown in FIG. 10E, the lens housing 142 is coupled to the exterior side of the first portion 1091 of each of the substrate assemblies 820 in the substrate strip array 1020.

In step 907, each camera module 800 is singulated from the strip array 1020 for integration with an electronic device, such as computing device 200.

In step 908, the interior side of the second portion 1092 of the substrate 820 is coupled with the molded enclosure 1070. This can be accomplished by depositing an adhesive to either or both the enclosure 1070 and the interior side of the substrate 820, as shown in FIG. 10G. Next, the substrate 820 is folded along fold lines 661, 662 to adhere the enclosure 1070 against the interior side of the first portion 1091 of the substrate, resulting in a camera module 800, similar in exterior appearance to the camera module 100 shown in FIG. 7A.

In step 909, the camera module 800 is coupled to the main board of the electronic device to form a completed camera assembly.

Figure 11:
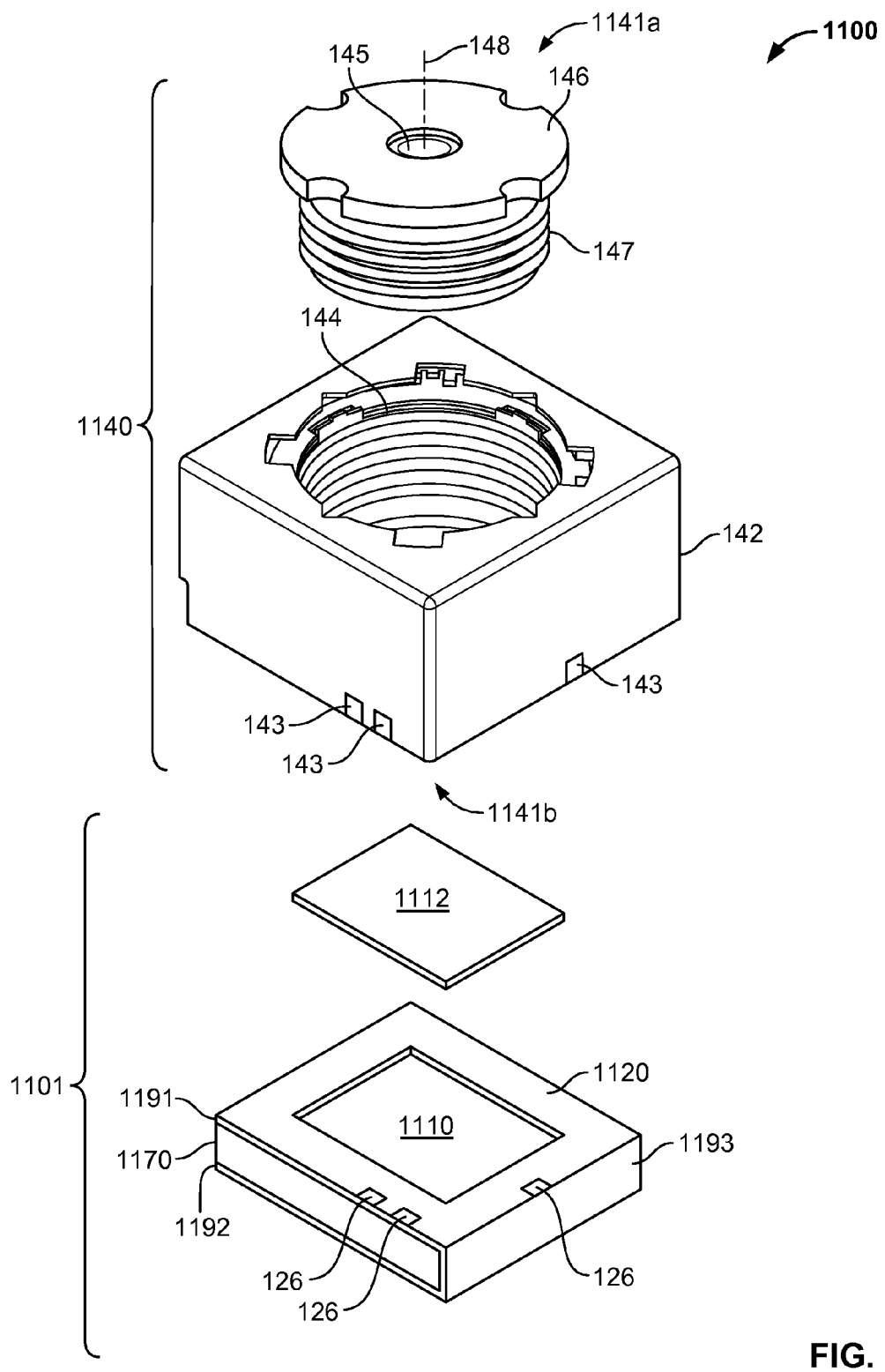
FIG. 11 is an exploded perspective view of a camera module, in accordance with other embodiments of the present invention.
Figure 12:
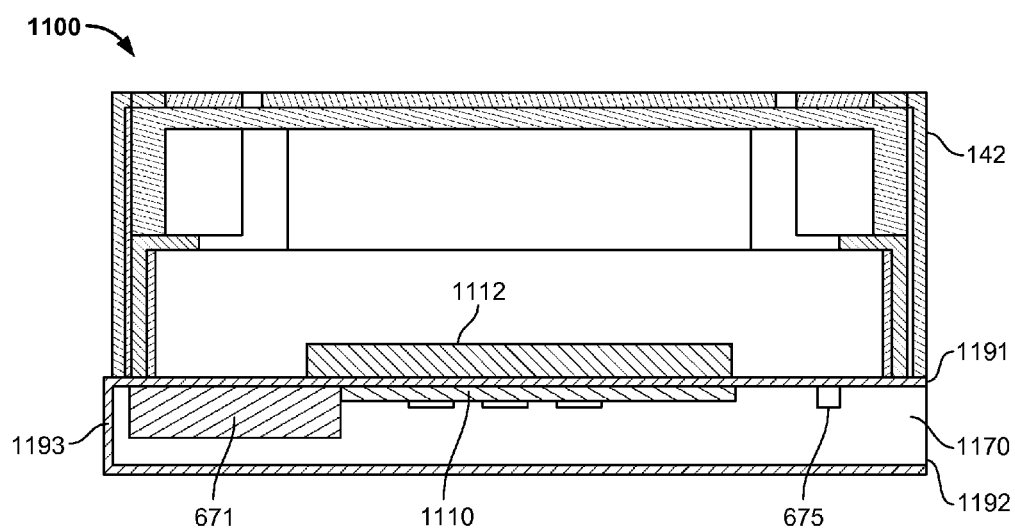
FIG. 12 is a cross-sectional view of the camera module in FIG. 11, in accordance with embodiments of the present invention.

FIG. 11 is an exploded perspective view of a camera module 1100 with a flexible substrate folded over a molded enclosure and a flip chip mounted image sensor die, in accordance with embodiments of the present invention. FIG. 12 is a cross-sectional view of the camera module 1100.

The camera module 1100 comprises a lens module 1140 and image sensor module 1101. The lens module 1140 is similar to the lens module 140 described above and comprises an autofocus lens housing 142 forming a cavity containing one or more lenses.

The image sensor module 1101 comprises an optical filter 1112 and a substrate 1120 which extends over the top and bottom sides of an enclosure 1170. The substrate 1120 comprises a first portion 1191 which is positioned on top of the enclosure 1170 adjacent to the image sensor side 1141b of the lens module 140, and a second portion 192 which is positioned on the bottom of the enclosure 1170 opposite the first portion 1191. The substrate 1120 also includes an image sensor opening 1122, which exposes the image sensor die 1110 to the light received by the lenses 145. The substrate 1120 may comprise any form of circuit substrate suitable to provide the necessary interconnection structure for operation of the camera module 1100, as described above.

Figure 13:
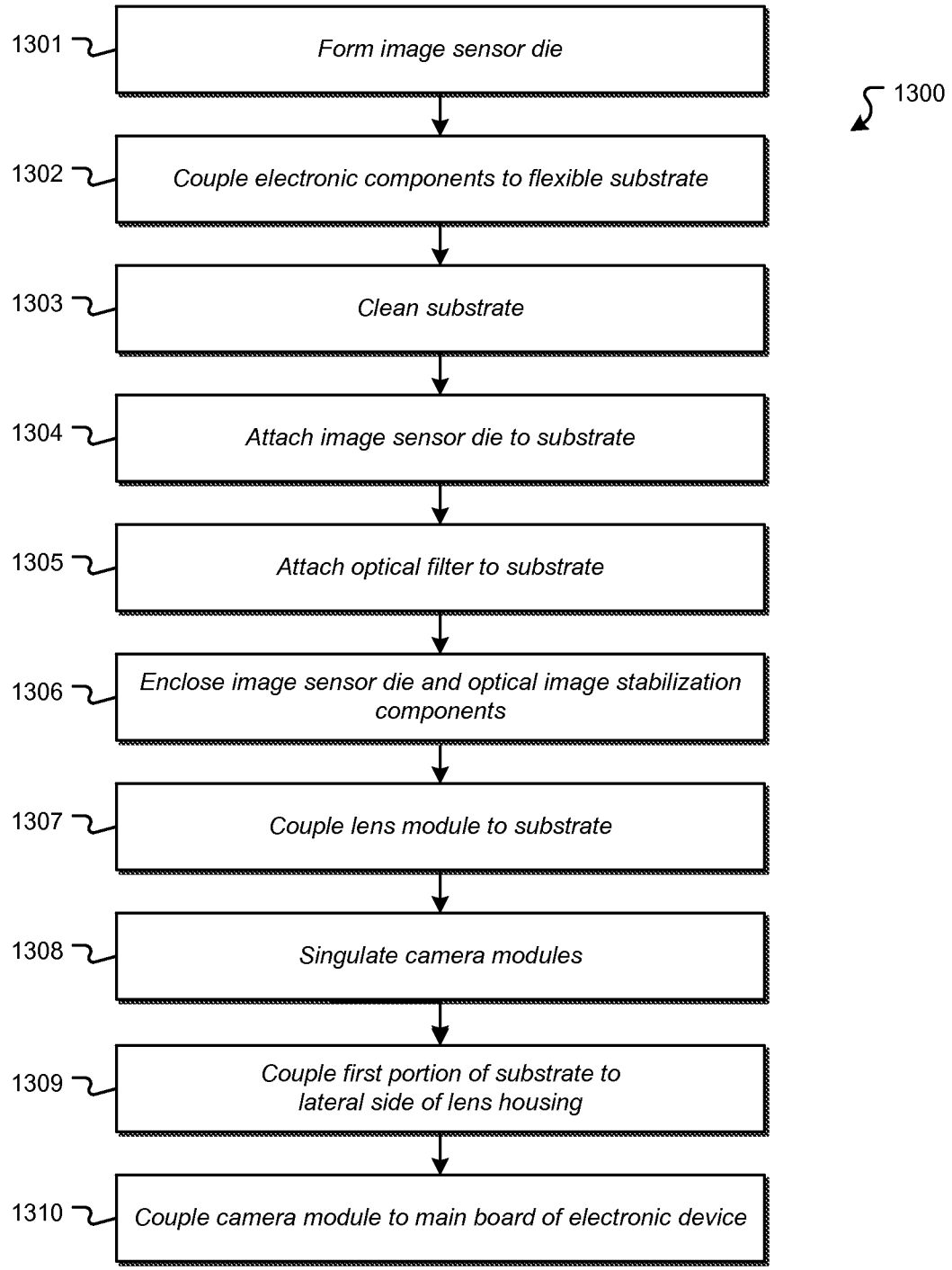
FIG. 13 is a flowchart illustrating a method of manufacturing a camera module of FIG. 12, in accordance with embodiments of the present invention.

FIG. 13 is a flowchart illustrating a method 1300 of manufacturing a camera module 100 with a flexible substrate folded over a molded enclosure, in accordance with embodiments of the present invention. FIGS. 14A-14F illustrate various steps in the manufacturing method 1300.

In step 1301, the image sensor die 1110 is formed. In the illustrated embodiment, the image sensor die 1110 is flip chip bonded to the substrate 1120. Accordingly, the die contacts on the image sensor die 1110 may comprise gold stud bumps, or any other type of suitable material and form, such as, e.g., sputter plated bumps, gold plated bumps, or copper pillar bumps.

Figure 14A:
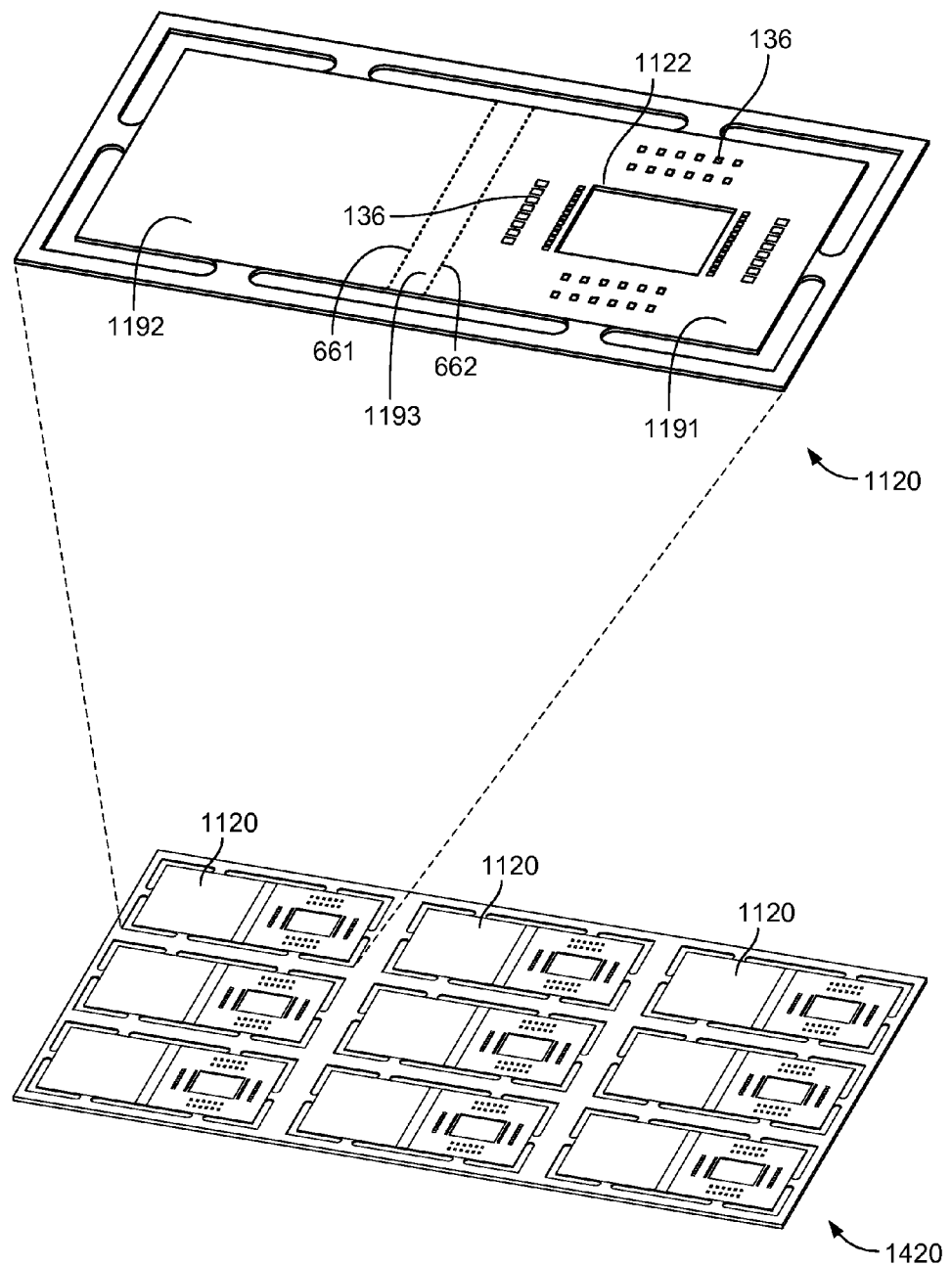
FIGS. 14A-14G illustrate various steps in the manufacturing process illustrated in FIG. 13.

FIG. 14A is a perspective view of the interior side of the substrate 1120. As with embodiments described above, the substrate 1120 will be folded to wrap around the enclosure 1170 such that the interior side of the substrate 1120 will face the enclosure 1170 and the exterior side will be exposed for coupling with the lens module 1140 and the main board of the electronic device into which the camera module 1100 is integrated.

Figure 14B:
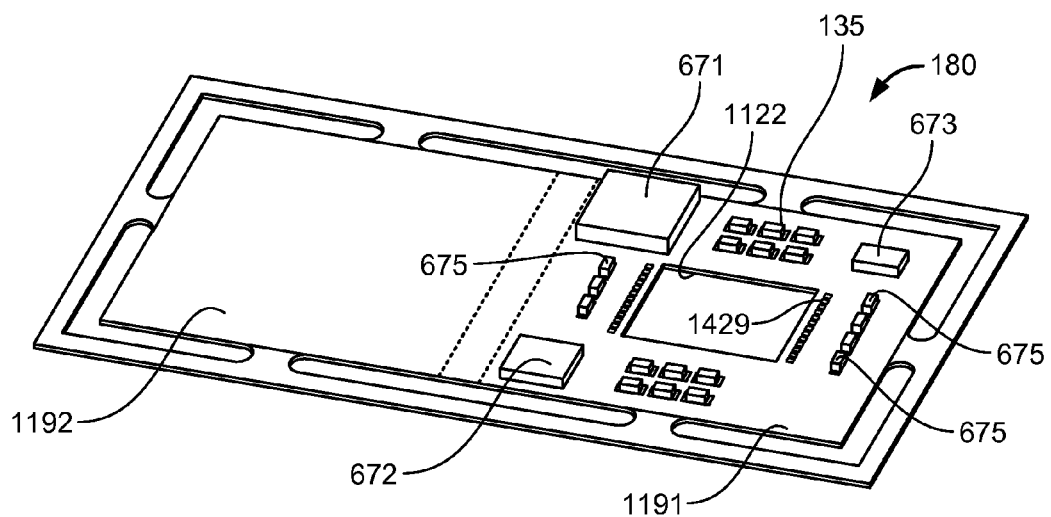
Figure 14C:
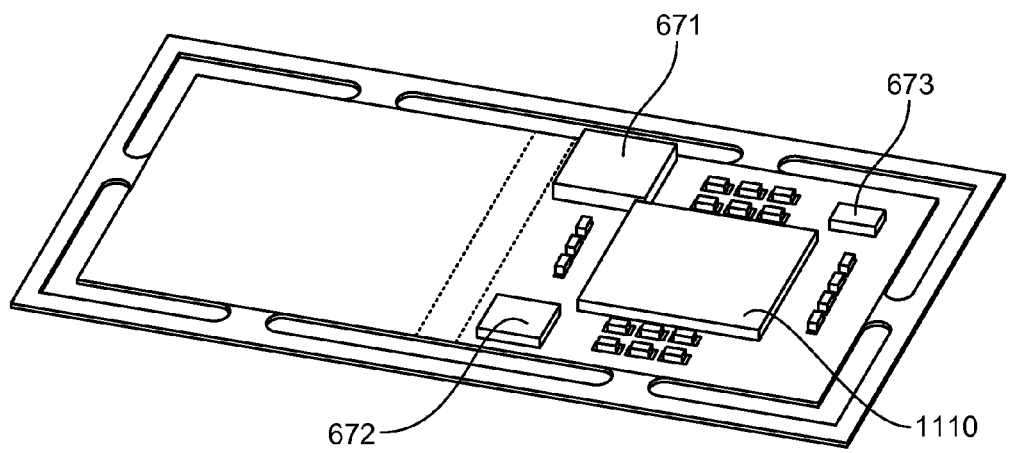

In step 1302, shown in FIGS. 14A-14B, a plurality of substrates 1120 are provided in a substrate strip array 1420 and components are coupled to the substrate 1120. As shown in FIG. 14A, the interior side of the first portion 1191 of each substrate 1120 includes a plurality of component contacts 136 positioned around one or more sides of the image sensor opening 1122. Electronic components may be coupled to each of these contacts 136 using, e.g., surface mount technology (SMT), as described above.

The components mounted to the first portion 1191 of the substrate 1120 may comprise image stabilization components 180 and passive electronic components 135, as described above. In this embodiment, the electronic components 135 may include decoupling capacitors for the image sensor die 1110 positioned close to the edges of the die 1110 that are not used for wire bonding. Other components not requiring close proximity to the die 1110 may be positioned along the edges of the die 1110 that are used for wire bonding or in the corners of the first portion 1191 of the substrate 1120.

In step 1303, the substrate 1120 is cleaned to remove impurities or other contaminants that may have been deposited onto the substrate 1120 in previous steps.

In step 1304, the image sensor die 1110 is attached to the substrate 1120. The bonding of the image sensor die 1110 to the substrate 1120 may be performed in a variety of ways. In the embodiment illustrated in FIG. 11C, flip chip bonding is used to bond gold stud bump die contacts on the die 1110 with substrate-sensor land pad contacts 1429 (shown in FIG. 14B).

In one embodiment, flip chip bonding using a conductive epoxy process followed by a jetting underfill process may be used. In another embodiment, flip chip bonding using a thermal ultrasonic (T/S) bonding process to form an inter-metallic coverage (IMC) between the die contacts and substrate-sensor contacts 1429 followed by a jetting underfill process may be used. In another embodiment, flip chip bonding using a thermal-compression (T/C) bonding process with a non-conductive paste (NCP) dispensed on the substrate-sensor contacts 1429 may be used. In another embodiment, flip chip bonding of plated bump die contacts using a T/C bonding process with an anisotropic conductive paste (ACP) dispensed on the substrate-sensor contacts 1429 may be used.

Figure 14D:
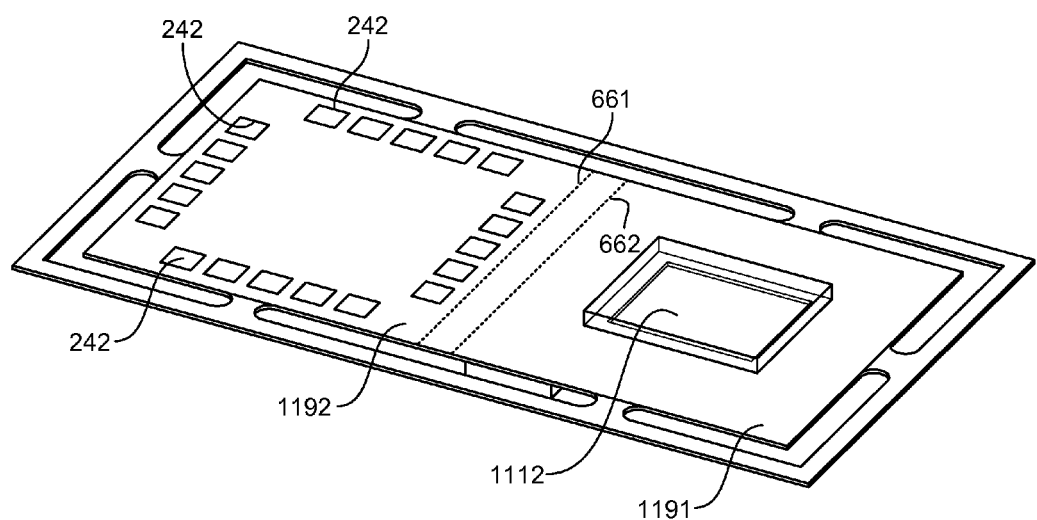

In step 1305, shown in FIG. 14D, the optical filter 1112 is coupled to the exterior side of the first portion 1191 of the substrate 1120. The optical filter 1112 can be any type of filter desired for the camera module 1100, similar to the optical filter 112 described above. The optical filter 1112 is bonded to the exterior side of the first portion 1191 around the image sensor opening 1122, thereby providing a protective seal to prevent contaminants and other debris from contacting the photosensor portion of the image sensor die 1110. This protection is particularly advantageous when the substrate 1120 is exposed to high levels of contaminants, as occurs during the transfer molding process described below. In some embodiments, the optical filter 1112 may be attached to the substrate 1120 prior to the flip chip mounting of the image sensor die 1110 to the substrate 1120.

Figure 14E:
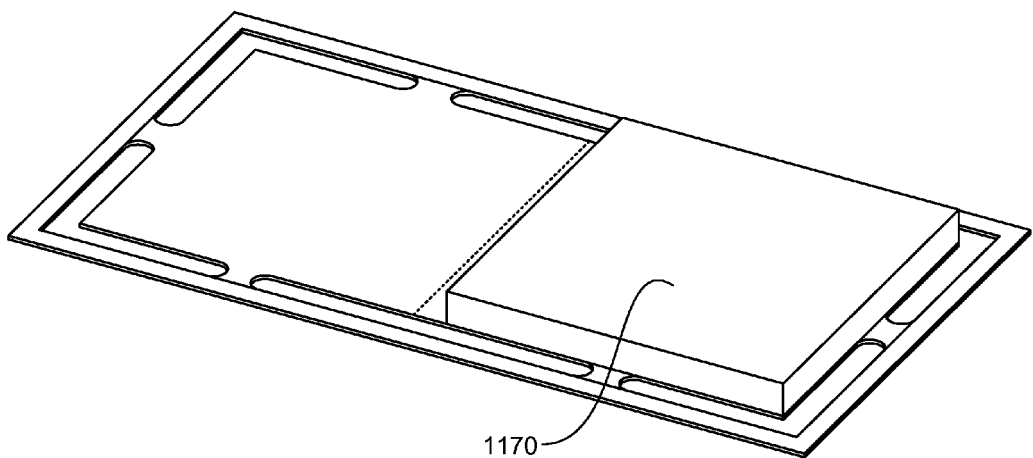

In step 1306, shown in FIG. 14E, the enclosure 1170 is coupled to the interior side of the first portion 1191 of the substrate 1120. The various devices coupled to the interior side of the first portion 1191 of the substrate 1120, including the image sensor die 1110 and the image stabilization components 180, are encapsulated in the enclosure 1170. In some embodiments, the enclosure 1170 comprises a transfer molded enclosure, as described above with respect to the enclosure 170. In the illustrated embodiment, the molded enclosure 1170 serves to protect the image stabilization components 180 and to provide a flat surface for bonding with the second portion 1192 of the substrate 1120. In other embodiments, the enclosure 1170 may comprise another material, such as a rigid enclosure comprising, e.g., a metal or polymer, formed prior to attachment to the substrate 1120, and attached to the substrate 1120 to enclose the image stabilization components 180 and image sensor die 1110.

Figure 14F:
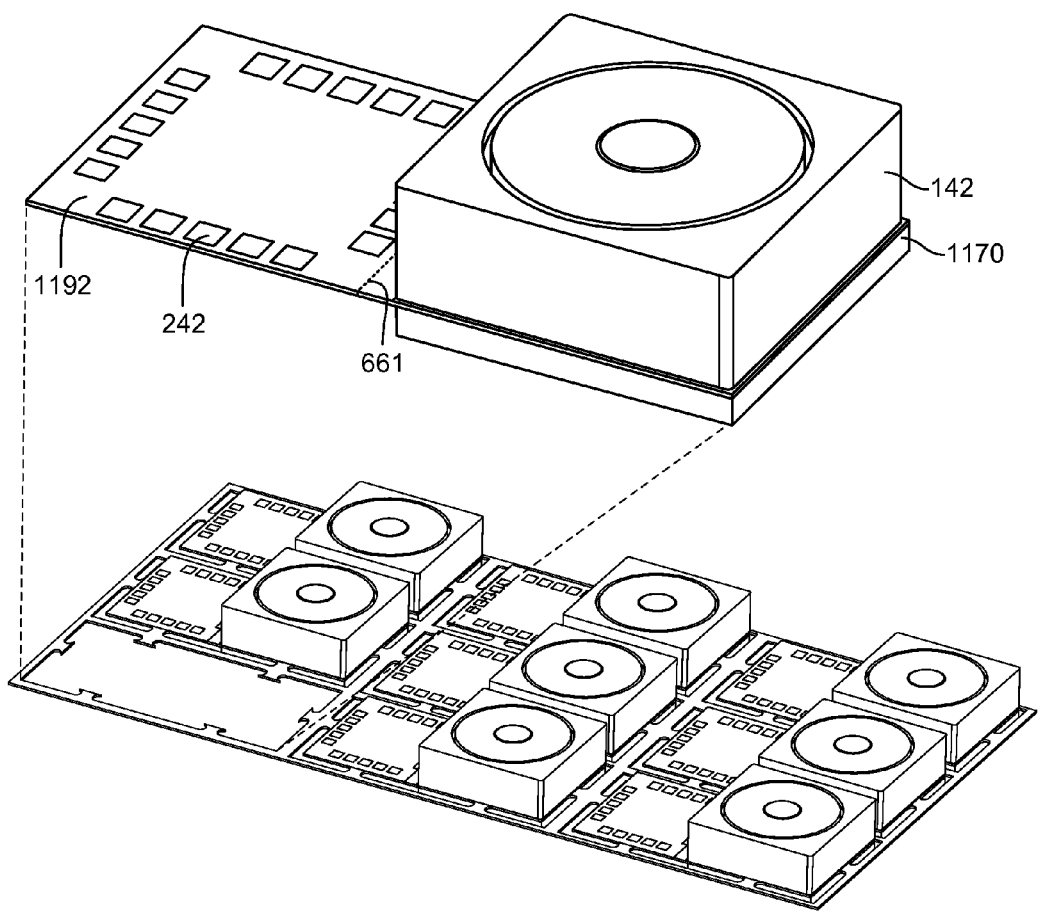

In step 1307, shown in FIG. 14F, a lens module 1140 is coupled to each of the substrates 1120 in the substrate strip array 1420.

In step 1308, each camera module 1100 may then be singulated from the strip array 1420 for integration with an electronic device. As described above, in some embodiments it may be desirable to couple the lens module 1140 to the substrate 1120 prior to singulation so that the batch test and active alignment process can be performed. In other embodiments, the substrates 1120 may be singulated prior to attaching the lens modules 1140.

Figure 14G:
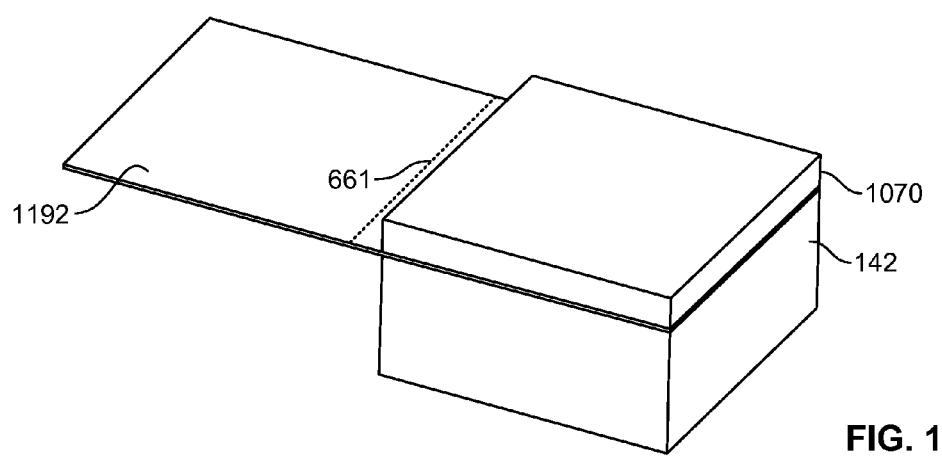

In step 1309, the interior side of the second portion 1192 of the substrate 1120 is coupled with the molded enclosure 1170. This can be accomplished by depositing an adhesive to either or both the enclosure 1170 and the interior side of the substrate 1120, as shown in FIG. 14G. Next, the substrate 1120 is folded along fold lines 661, 662 to press the enclosure 1170 so as to adhere the enclosure 1170 to the interior side of the first portion 1191 of the substrate 1120, thereby resulting in the camera module 1100, similar in exterior appearance to the camera module 100 shown in FIGS. 7A-7B.

In step 1310, the camera module 1100 is coupled to the main board of the electronic device to form a completed camera assembly.

The above-described embodiments may achieve a number of advantages over conventional camera module designs. The overall size of the camera module may be reduced and, in particular, the footprint of the camera module may be reduced by positioning the various OIS and other electronic components underneath the lens module rather than on a portion of the substrate extending out from the lens module. In addition, in some embodiments, the molded enclosure is sized so as to have approximately the same length and width of the image sensor side of the lens module. As a result, the camera module is provided with a roughly rectangular form factor. This may improve the ease with which the camera module is handled in later processing steps, such as when coupling the camera module to the main board of the electronic device 200. In other embodiments, the molded enclosure may have different dimensions from the lens module. This may be desirable if the region of the substrate to be enclosed by the molded enclosure is smaller than the image sensor side of the lens module. In this case, the enclosure may be smaller than the image sensor side, such as, e.g., ¾, ½, or ¼ of the size of the image sensor side of the lens module. In other embodiments, the enclosure may be larger than the image sensor side of the lens module.

Because HDI tape substrates provide much higher line pitch than conventional laminate substrates, the use of HDI tape substrates can enable a reduction in the number of layers necessary for the interconnect structure of the substrate. Exemplary HDI tape substrates may have, for example, a line pitch of between 16 μm-50 μm.

Flip chip bonding of an image sensor die utilizes the application of pressure and heat to the back side of the die, which requires that the die be thick enough to withstand the pressure without damage. However, when the image sensor die is wire bonded to the substrate assembly, as described in embodiments above, pressure and heat need not be applied to the die, thereby enabling a reduction in die thickness.

In addition, the ability to perform numerous steps in the manufacturing process while the substrate assemblies remain in strip array format can enable more efficient batch processing, thereby reducing the cost per unit. Flexible tape substrates may be provided in even larger strips than conventional ceramic and laminate strip arrays, thereby increasing the number of camera modules that may be manufactured in each batch, resulting in an improvement in the manufacturing units per hour (UPH).

Although the flowcharts and methods described herein may describe a specific order of execution, it is understood that the order of execution may differ from that which is described. For example, the order of execution of two or more blocks or steps may be scrambled relative to the order described. Also, two or more blocks or steps may be executed concurrently or with partial concurrence. Further, in some embodiments, one or more of the blocks or steps may be skipped or omitted. It is understood that all such variations are within the scope of the present disclosure.

It should be emphasized that the above-described embodiments of the present disclosure are merely possible examples of implementations set forth for a clear understanding of the principles of the disclosure. Many variations and modifications may be made to the above-described embodiment(s) without departing substantially from the spirit and principles of the disclosure. The various features and processes described above may be used independently of one another, or may be combined in various ways. All possible combinations and subcombinations are intended to fall within the scope of this disclosure.

In addition, conditional language, such as, among others, "can," "could," "might," or "may," unless specifically stated otherwise, or otherwise understood within the context as used, is generally intended to convey that certain embodiments include, while other embodiments do not include, certain features, elements and/or steps.

Although this disclosure has been described in terms of certain example embodiments and applications, other embodiments and applications that are apparent to those of ordinary skill in the art, including embodiments and applications that do not provide all of the benefits described herein, are also within the scope of this disclosure. The scope of the inventions is defined only by the claims, which are intended to be construed without reference to any definitions that may be explicitly or implicitly included in any incorporated-by-reference materials.

What is claimed is:

1. A camera module, comprising:
   a first substrate having an upper surface and an opposing lower surface;
   a plurality of contacts disposed on the lower surface of the first substrate;
   a molded enclosure enclosing a gyroscopic sensor and an image stabilization logic module, said molded enclosure having an upper side and a lower side, said lower side being coupled to the upper surface of the first substrate;
   a second substrate having an upper surface and an opposing lower surface, said lower surface of the second substrate being coupled to the molded enclosure;
   an image sensor die coupled to the upper surface of the second substrate; and
   a lens module comprising a lens housing and at least one lens contained in the lens housing, said lens module being coupled to the upper surface of the second substrate.

2. The camera module of claim 1, wherein:
   the image sensor die comprises a plurality of die contacts wire bonded to the upper surface of the second substrate.

3. The camera module of claim 1, further comprising a third substrate coupled to the first substrate and the second substrate.

4. A camera assembly, comprising:
   a substrate comprising a first portion and a second portion;

an image sensor die coupled to the first portion of the substrate such that the image sensor die is disposed between the first and second portions of the substrate;

an enclosure coupled between the first and second portions of the substrate, said image sensor die being contained within the enclosure;

a plurality of camera components coupled to the substrate and disposed within the enclosure; and a lens module coupled to the first portion of the substrate.

5. The camera assembly of claim 4, wherein the second portion of the substrate comprises a main board contact region for coupling with circuit board contacts on a circuit board for an electronic device, said main board contact region being electrically coupled to the image sensor die via interconnects in the substrate.

6. The camera assembly of claim 4, wherein the enclosure comprises a transfer molding material enclosing the plurality of camera components.

7. A camera assembly, comprising:
   a flexible substrate comprising a first portion and a second portion;
   an image sensor die coupled to the first portion of the substrate, the image sensor die comprising a plurality of die contacts wire bonded to the substrate;
   an enclosure coupled between the first and second portions of the substrate;
   a plurality of camera components coupled to the substrate and disposed within the enclosure; and
   a lens module coupled to the first portion of the substrate such that the image sensor die is positioned between the substrate and the lens module.

8. The camera assembly of claim 4, wherein:
   the plurality of camera components are coupled to the first portion of the substrate adjacent the image sensor die and comprise a gyroscopic sensor and an image stabilization logic module.

9. The camera assembly of claim 4, wherein the plurality of camera components are coupled to the second portion of the substrate.

10. The camera assembly of claim 7, wherein:
    the plurality of camera components are coupled to a first side of the first portion of the substrate; and
    the image sensor die is coupled to a second side of the first portion of the substrate opposite the plurality of camera components.

11. The camera assembly of claim 4, wherein the plurality of camera components comprises a gyroscopic sensor and an image stabilization logic module.

12. The camera assembly of claim 11, wherein the lens module comprises at least one lens, said camera assembly further comprising:
    an actuator for translating the at least one lens or the image sensor die in response to control signals from the image stabilization logic module.

13. The camera assembly of claim 11, wherein:
    the substrate further comprises a third portion between the first and second portions, said substrate being folded at a junction between the first portion and the third portion, and folded at a junction between the second portion and the third portion.

14. A method of forming a camera assembly, comprising:
    coupling a plurality of electronic components to a substrate having a first portion and a second portion;
    coupling an image sensor die to the substrate;
    coupling an enclosure to the first portion of the substrate to enclose the plurality of electronic components and the image sensor die; and
    coupling the second portion of the substrate to the enclosure, thereby positioning the enclosure, the image sensor die, and the plurality of electronic components between the first and second portions of the substrate.

15. The method of claim 14, wherein said coupling the enclosure to the first portion of the substrate comprises forming a transfer mold enclosure on the first portion of the substrate to enclose the plurality of electronic components and the image sensor die.

16. The method of claim 14, wherein said coupling the image sensor die to the substrate comprises bonding an image sensor die to each substrate in an array of substrates in a substrate tape panel, said method further comprising:
    after bonding the image sensor die to each substrate in the array of substrates, singulating each of the substrates from the array of substrates.

17. The method of claim 14, wherein the substrate comprises one or more of a high density interconnect (HDI) tape substrate or a polyimide tape substrate.

18. The method of claim 14, wherein:
    the first portion of the substrate comprises an opening; and
    said bonding the image sensor die to the second portion of the substrate comprises bonding the image sensor die adjacent to the opening.

\* \* \* \* \*